(12) United States Patent
Hashimoto

(10) Patent No.: US 6,670,700 B1
(45) Date of Patent: Dec. 30, 2003

(54) INTERCONNECT SUBSTRATE AND SEMICONDUCTOR DEVICE ELECTRONIC INSTRUMENT

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 87 days.

(21) Appl. No.: 09/807,605

(22) PCT Filed: Aug. 11, 2000

(86) PCT No.: PCT/JP00/05394

§ 371 (c)(1),
(2), (4) Date: Apr. 16, 2001

(87) PCT Pub. No.: WO01/15231

PCT Pub. Date: Mar. 1, 2001

(30) Foreign Application Priority Data

Aug. 19, 1999 (JP) .............................. 11-232566

(51) Int. Cl.[7] .................. H01L 23/02; H01L 23/48; H01L 23/52
(52) U.S. Cl. .............. 257/686; 257/700; 257/702; 257/723; 257/777; 257/690; 257/692; 257/698; 257/730
(58) Field of Search ............... 257/777, 686, 257/700, 702, 723, 730, 692, 698, 690; 361/749, 789

(56) References Cited

U.S. PATENT DOCUMENTS

| | | | |
|---|---|---|---|
| 5,072,331 A | * | 12/1991 | Thiele et al. ............... 361/380 |
| 5,140,745 A | * | 8/1992 | McKenzie, Jr. ............... 29/652 |
| 5,239,448 A | * | 8/1993 | Perkins et al. ............... 361/764 |
| 5,258,648 A | * | 11/1993 | Lin ............................. 257/778 |
| 5,598,033 A | * | 1/1997 | Behlen et al. ............... 257/686 |
| 5,677,575 A | * | 10/1997 | Maeta et al. ................ 257/778 |
| 5,776,797 A | * | 7/1998 | Nicewarner, Jr. et al. ... 438/107 |
| 6,157,541 A | * | 12/2000 | Hacke ........................ 361/749 |
| 6,225,688 B1 | * | 5/2001 | Kim et al. ................... 257/686 |

FOREIGN PATENT DOCUMENTS

| | | |
|---|---|---|
| JP | U 63-75069 | 5/1988 |
| JP | U 3-25255 | 3/1991 |
| JP | A 3-283485 | 12/1991 |
| JP | U 63-75069 | 3/1998 |
| JP | A 11-135715 | 5/1999 |

* cited by examiner

*Primary Examiner*—Tom Thomas
*Assistant Examiner*—Nitin Parekh
(74) *Attorney, Agent, or Firm*—Oliff & Berridge, PLC

(57) ABSTRACT

An interconnect substrate includes an upper substrate (30) on which an upper interconnect pattern (32) is formed, and a lower substrate (40) on which a lower interconnect pattern (42) is formed and to which the upper substrate (30) is adhered. The lower interconnect pattern (42) includes first lower land section (53) which are formed in the center portion of a first region (50) and are connected to the upper interconnect pattern (32), second lower land sections (64) which are formed in a second region (60) and are electrically connected to a second electronic chip, and lower connection sections (45) which run outside the center portion in the first region (50) than the center portion and connect the first lower land section (53) to the second lower land section (64).

38 Claims, 13 Drawing Sheets

F I G. 16
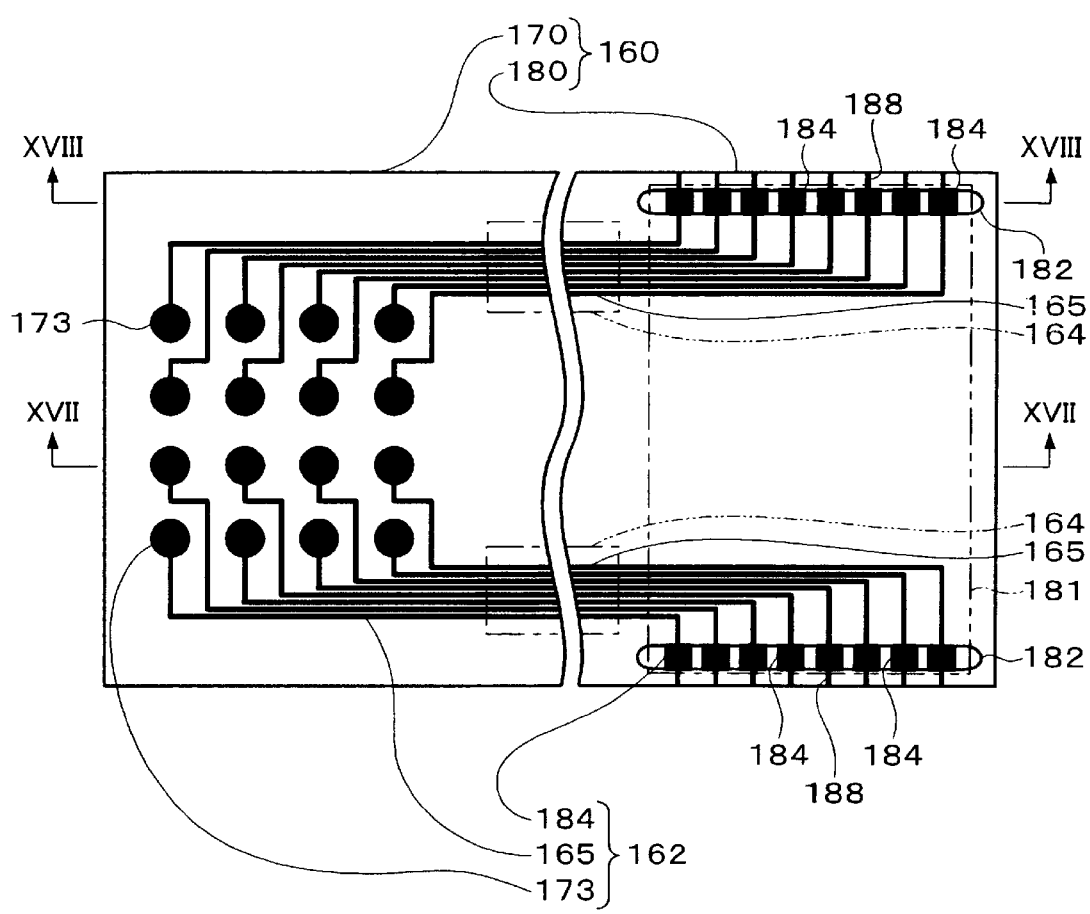

INTERCONNECT SUBSTRATE AND SEMICONDUCTOR DEVICE ELECTRONIC INSTRUMENT

TECHNICAL FIELD

The present invention relates to an interconnect substrate, a semiconductor device and a method of manufacturing the same, a circuit hoard, and an electronic instrument.

BACKGROUND OF ART

Multi-chip modules formed by mounting a plurality of semiconductor chips on an interposer have been known. An interconnect pattern is formed on the interposer. The interconnect pattern includes a plurality of lands for connecting a plurality of electrodes of the semiconductor chips and a plurality of lands for forming external terminals.

In the case where the lands for forming external terminals are concentrated in the region of the interposer on which one of the semiconductor chips is mounted, the interconnect pattern must be formed so as to run between the lands for connecting the electrodes of the semiconductor chip.

However, as electronic parts are mounted in higher density, there have been cases where no space is available for allowing the interconnect pattern to run between the lands. In such cases, the interconnect pattern must take a roundabout route in order to avoid the lands.

DISCLOSURE OF THE INVENTION

The present invention has been achieved to solve this problem. An objective of the present invention is to provide an interconnect substrate capable of preventing the interconnect length from increasing, a semiconductor device and a method of manufacturing the same, a circuit board, and an electronic instrument.

(1) An interconnect substrate according to the present invention comprises:

an upper substrate including a mounting region for a first electronic chip and an upper interconnect pattern; and a lower substrate including a first region to which the upper substrate is adhered, a second region including amounting region for a second electronic chip, and a lower interconnect pattern, wherein the lower interconnect pattern comprises a plurality of first lower land sections which are formed in the center portion of the first region and are electrically connected to the upper interconnect pattern, a plurality of second lower land sections which are formed in the second region and electrically connected to the second electronic chip, and a plurality of lower connection sections which run outside the center portion in the first region and connect the first lower land sections to the second lower land sections.

According to the present invention, second upper land sections electrically connected to the first electronic chip and the second lower land sections electrically connected to the second electronic chip are formed on different substrates. Therefore, it is unnecessary to form the:lower connection sections between the second upper land sections. As a result, an increase in the interconnect length can be prevented.

Since the interconnect substrate according to the present invention uses the upper substrate and the lower substrate, the interconnect substrate can be formed at low cost in comparison with built-up substrates.

In addition, since the lower connection sections run outside the first lower land sections, the lower connection sections can be formed by effectively using space on the lower substrate.

(2) In this interconnect substrate, the upper interconnect pattern may comprise a plurality of first upper land sections which are formed in the center portion of the upper substrate and are electrically connected to the first lower land sections, a plurality of second upper land sections which are electrically connected to the first electronic chip, and a plurality of upper connection sections which connect the first upper land sections to the second upper land sections.

According to this feature, since the upper connection sections only connect the first upper land sections to the second upper land sections, the upper connection sections can be formed through the shortest route.

(3) In this interconnect substrate, the lower substrate may be rectangular, the first region and the second region may be disposed side by side, one end portion of a pair of parallel end portions of the first region and one end portion of a pair of parallel end portions of the second region may be disposed along one side of a pair of parallel sides of the lower substrate, and the other end portion of a pair of parallel end portions of the first region and the other end portion of a pair of parallel end portions of the second region may be disposed along the other side of a pair of parallel sides of the lower substrate.

(4) In this interconnect substrate, the second lower land sections may be formed in a pair of parallel end portions of the second region, and the second upper land sections may be formed in a pair of parallel end portions of the upper substrate above a pair of parallel end portions of the first region of the lower substrate.

According to this feature, the second lower land sections electrically connected to the second electronic chip are formed in the end portions of the second region of the lower substrate. The second upper land sections electrically connected to the first electronic chip are formed above the, end portions of the first region of the lower substrate. The second lower land sections and the second upper land sections are formed in rows.

A plurality of electrodes of the first and second electronic chips mounted on this interconnect substrate are formed in two parallel end portions. The first and second electronic chips are mounted with the electrodes being disposed on the end portions of the upper substrate and the lower substrate.

(5) In this interconnect substrate, the second upper land sections and the second lower land sections may be formed in the same arrangement pattern, and one of the second upper land sections and one of the second lower land sections formed at the same position in each arrangement pattern may be electrically connected to the same first upper land section and the same first lower land section.

According to this feature, the same, electronic chip as the first and second electronic chips can be used.

(6) In this interconnect substrate, dummy patterns electrically insulated from the upper interconnect pattern and the lower interconnect pattern may be formed in a pair of parallel end portions of the first region of the lower substrate to the same thickness as the lower interconnect pattern.

According to this feature, the upper substrate can be supported by the dummy patterns in the case where a lower interconnect pattern is not been formed under the second upper land sections of the upper substrate, whereby the pattern can be planarized.

(7) In this interconnect substrate, an insulation film may be formed on the lower connection sections at least in the area across the first and second regions.

This prevents occurrence of short circuits between the lower connection sections.

(8) In this interconnect substrate, the upper interconnect pattern may be formed on one surface of the upper substrate, the lower interconnect pattern may be formed on one surface of the lower substrate, and the surface of the upper substrate opposite to the surface on which the upper interconnect pattern is formed may be adhered to the surface of the lower substrate. on which the lower interconnect pattern is formed.

According to this feature, the upper interconnect pattern and the lower interconnect pattern respectively formed on the upper substrate and the lower substrate are disposed facing in the same direction.

(9) In this interconnect substrate, a plurality of through-holes may be formed in the upper substrate, and the first upper land sections and the first lower land sections may be electrically connected via the through-holes.

(10) In this interconnect substrate, the first upper land sections may be formed over the through-holes, the through-holes may be located over the first lower land sections, and a conductive material in contact with the first upper land sections and the first lower land sections may be provided in the through-holes.

(11) In this interconnect substrate, a plurality of through-holes for forming a plurality of external terminals which are electrically connected to the first lower land sections and project from a surface of the lower substrate opposite to a surface on which the lower interconnect pattern is formed, may be formed in the lower substrate.

(12) In this interconnect substrate, the lower connection sections may run closer to the center than the second lower land sections in the second region.

According to this feature, since the lower connection sections run closer to the center than the second lower land sections, the lower connection sections can be formed without increasing the area of the lower substrate.

(13) In this interconnect substrate, at least one hole for electrically connecting the second lower land sections to a surface of the lower substrate opposite to a surface on which the lower interconnect pattern is formed, may be formed in the second region of the lower substrate.

(14) In this interconnect substrate, the hole may be a slit, part of the lower interconnect pattern may be formed across the slit, and the second lower land sections maybe formed over the slit.

According to this feature, the second lower land sections can be exposed to both surfaces of the lower substrate by merely forming the slits. This enables the mounting regions for the electronic chips to be formed on both surfaces of the lower substrate.

(15) An interconnect substrate according to the present invention on which electronic chips are respectively mounted in a plurality of adjacent mounting regions, the interconnect substrate comprises:
   a plurality of first land sections for external connection which are formed in one of the mounting regions located at an end portion;
   a plurality of second land sections which are formed in each of the mounting regions and are electrically connected to each of the electronic chips; and
   a plurality of connection sections which electrically connect the second land sections respectively formed in the adjacent mounting regions,
   wherein the connection sections are formed outside the second land sections in an area between the one of the mounting regions in which the first land sections are formed and another of the mounting regions adjacent to the one of the mounting regions, and
   wherein the connection sections are formed inside the second land sections in an area between the mounting regions at an uneven-numbered position from the first land sections and the mountings region at an even-numbered position from the first land sections.

According to the present invention, the connection sections electrically connect the second land sections in each of the adjacent mounting regions. The connection sections formed outside the second land sections and the connection sections formed inside the second land sections are formed alternately in every mounting region. Therefore, since the connection sections do not run between the second land sections, the connection sections can be formed through the shortest route.

The connection sections are formed outside the second land sections between the mounting region in which the first land sections are formed and the mounting region adjacent thereto. Therefore, the connection sections can be formed by effectively using space. As a result, an increase in the interconnect length can be prevented.

Moreover, the interconnect substrate according to the present invention can be formed at low cost in comparison with built-up substrates.

(16) In this interconnect substrate, the second land sections may be formed outside the first land sections.

(17) In this interconnect substrate, the mounting regions may be aligned in one direction, and the second land sections may be aligned in the direction in which the mounting regions are aligned.

(18) In this interconnect substrate, the second land sections may be formed in each of the mounting regions in the same alignment pattern, and a pair of second land sections formed at a line-symmetrical position with respect to a boundary between the mounting regions may be electrically connected in the adjacent mounting regions.

According to this feature, electronic chips having a mirror-reversed structure can be mounted in the adjacent mounting regions.

(19) In this interconnect substrate, an insulation film may be formed on the connection sections at least in the area across the adjacent mounting regions.

This prevents occurrence of short circuits between the connection sections.

(20) An interconnect substrate according to the present invention comprises a first region, a second region which is formed adjacent to the first region and includes a mounting region for an electronic chip, and an interconnect pattern,
   wherein the interconnect pattern comprises a plurality of first land sections formed in the first region, a plurality of second land sections which are formed in the second region and are electrically connected to the electronic chip, and a plurality of connection sections which run closer to a center than the second land sections in the second region and electrically connect the first land sections to the second land sections.

According to the present invention, the connection sections which connect the first and second land sections run closer to the center than the second land sections in the second region, thereby preventing the area of the interconnect substrate from increasing outside the second land sections. Specifically, the connection sections can be formed by effectively using space. As a result, an increase in the interconnect length can be prevented.

(21) In this interconnect substrate, the interconnect substrate may be rectangular, and pairs of parallel end sections of the first and second regions may be connected to form a pair of parallel sides of the rectangle.

(22) In this interconnect substrate, the second land sections may be formed in a pair of parallel end portions of the second region continuous with the first region.

According to this feature, the second land sections electrically connected to the electronic chip are formed in the end portions of the second region of the interconnect substrate.

A plurality of electrodes of the electronic chip mounted on this interconnect substrate is formed in two parallel end portions. The electronic chip is mounted on the interconnect substrate with the electrodes being disposed on the end portions of the interconnect substrate.

(23) In this interconnect substrate, a plurality of through-holes for forming external terminals, which are electrically connected to the first land-sections and are projected from a surface opposite to a surface on which the interconnect pattern is formed, may be formed in the first region.

(24) In this interconnect substrate, an insulation film may be formed on the connection sections at least in the area across the first and second regions.

This prevents occurrence of short circuits between the connection sections.

(25) In this interconnect substrate, at least one hole for electrically connecting the second land sections to a surface opposite to a surface on which the interconnect pattern is formed, may be formed in the second region.

(26) In this interconnect substrate, the hole may be a slit, part of the interconnect pattern may be formed across the slit, and the second land sections may be formed on the slit.

According to this feature, the second land sections can be exposed to both surfaces of the interconnect substrate by only forming the slits. This enables the mounting regions for the electronic chips to be formed on both surfaces of the interconnect substrate.

(27) A semiconductor device according to the present invention comprises the above-described interconnect substrate, a first semiconductor chip mounted in the mounting region of the upper substrate, and a second semiconductor chip mounted in the mounting region of the lower substrate.

According to the present invention, since the second upper land sections electrically connected to the first electronic chip and the second lower land sections electrically connected to the second electronic chip are formed on different substrates, the lower connection sections are not formed to run between the second upper land sections. As a result, an increase in the interconnect length can be prevented.

Since the lower connection sections run outside the first lower land sections, the lower connection sections are formed by effectively using space on the lower substrate.

(28) This semiconductor device may further comprise a third semiconductor chip electrically connected to the second lower land sections through the holes, and is mounted on a surface of the lower substrate opposite to a surface on which the second semiconductor chip is mounted.

According to this feature, since the semiconductor chips are mounted on both surfaces of the lower substrate, a high-density semiconductor device can be provided by effectively using the area of the semiconductor device.

(29) In this semiconductor device, the second and third semiconductor chips may have a mirror-symmetrical circuit structure with respect to a boundary of the lower substrate.

According to this feature, the same devices can be electrically connected to the same second lower layer land section through the shortest route.

(30) In this semiconductor device, the first and second semiconductor chips may be layered by bending the lower substrate.

This enables miniaturization of the semiconductor device.

(31) A semiconductor device according to the present invention comprises the above-described interconnect substrate, and semiconductor chips mounted in each mounting region.

According to the present invention, the connection sections electrically connect the second land sections in the adjacent mounting regions. The connection sections formed outside the second land sections and the connection sections formed inside the second land sections are formed alternately in every mounting region. Therefore, since the connection sections do not run between the second land sections, the connection sections are formed through the shortest route.

The connection sections are formed outside the second land sections between the mounting region in which the first land sections are formed and the mounting region adjacent thereto. Therefore, the connection sections are formed by effectively using space. As a result, an increase in the interconnect length can be prevented.

(32) In this semiconductor device, the semiconductor chips respectively mounted in the mounting regions may be layered by bending the interconnect substrate.

This enables miniaturization of the semiconductor device.

(33) A semiconductor device according to the present invention comprises the above-described interconnect substrate, and a first semiconductor chip mounted in the mounting region.

According to the present invention, the connection sections which connect the first and the second land sections run closer to the center than the second land sections in the second region, thereby preventing the area of the interconnect substrate from extending outside the second land sections. Specifically, the connection sections can be formed by effectively using space. As a result, an increase in the interconnect length can be prevented.

(34) This semiconductor device may further comprise a second semiconductor chip electrically connected to the second land sections through the holes, and is mounted on a surface of the lower substrate opposite to a surface on which the first semiconductor chip is mounted.

According to this feature, since the semiconductor chips are mounted on both surfaces of the interconnect substrate, a high-density semiconductor device can be provided by effectively using the area of the semiconductor device.

(35) In this semiconductor device, the first and second semiconductor chips may have a mirror-symmetrical circuit structure with respect to a boundary of the interconnect substrate.

According to this feature, the same devices can be electrically connected to the same second layer land section through the shortest route.

(36) In this semiconductor device, the first land sections may be disposed inside the mounting region by bending the interconnect substrate.

According to this feature, since the first land sections are disposed inside the mounting region, a semiconductor device having a size approximately same as the semiconductor chips can be provided.

(37) A circuit board according to the present invention is equipped with the above semiconductor device.

(38) An electronic instrument according to the present invention comprises the above semiconductor device.

(39) A method of manufacturing a semiconductor device according to the present invention comprises a step of mounting a first semiconductor chip in the mounting region of the upper substrate of the above-described interconnect substrate, and mounting a second semiconductor chip in the mounting region of the lower substrate.

According to the present invention, since the second upper land sections electrically connected to the first electronic chip and the second lower land sections electrically connected to the second electronic chip are formed on different substrates, the lower connection sections are not formed to run between the second upper land sections. As a result, an increase in the interconnect length can be prevented.

Since the lower connection sections run outside the first lower land sections, the lower connection sections are formed by effectively using space on the lower substrate.

(40) This method of manufacturing a semiconductor device may further comprise a step of mounting a third semiconductor chip on a surface of the lower substrate opposite to a surface on which the second semiconductor chip is mounted in a manner of electrically connecting the third semiconductor chip to the second lower land sections through the holes.

According to this method, since the semiconductor chips are mounted on both surfaces of the lower substrate, a high-density semiconductor device can be manufactured by effectively using the area of the semiconductor device.

(41) In this method of manufacturing a semiconductor device, the second and third semiconductor chips may have a mirror-symmetrical circuit structure with respect to a boundary of the lower substrate.

According to this feature, the same devices can be electrically connected to the same second lower layer land section through the shortest route.

(42) In this method of manufacturing a semiconductor device, the first and second semiconductor chips may be layered by bending the lower substrate.

This enables miniaturization of the semiconductor device.

(43) A method of manufacturing a semiconductor device according to the present invention comprises a step of mounting semiconductor chips respectively in the mounting regions of the above-described interconnect substrate.

According to the present invention, the connection sections electrically connect the second land sections in the adjacent mounting regions. The connection sections formed outside the second land sections and the connection sections formed inside the second land sections are formed alternately in every mounting region. Therefore, since the connection sections do not run between the second land sections, the connection sections are formed through the shortest route.

Since the connection sections are formed outside the second land sections between the mounting region in which the first land sections are formed and the mounting region adjacent thereto, the connection sections are formed by effectively using space. As a result, an increase in the interconnect length can be prevented.

(44) In this method of manufacturing a semiconductor device, the semiconductor chips respectively mounted in the mounting regions may be layered by bending the interconnect substrate.

This enables miniaturization of the semiconductor device.

(45) A method of manufacturing a semiconductor device according to the present invention comprises a step of mounting a first semiconductor chip in the mounting region of the above-described interconnect substrate.

According to the present invention, the connection sections which connect the first and the second land sections run closer to the center than the second land sections in the second region, thereby preventing the area of the interconnect substrate from extending outside the second land sections. Specifically, the connection sections can be formed by effectively using space. As a result, an increase in the interconnect length can be prevented.

(46) This method of manufacturing a semiconductor device may further comprise a step of mounting a second semiconductor chip on a surface of the interconnect substrate opposite to a surface on which the first semiconductor chip is mounted, in a manner of electrically connecting the third semiconductor chip to the second land sections through the holes.

According to this method, since the semiconductor chips are mounted on both surfaces of the interconnect substrate, a high-density semiconductor device can be manufactured by effectively using the area of the semiconductor device.

(47) In this method of manufacturing a semiconductor device, the first and second semiconductor chips may have a mirror-symmetrical circuit structure with respect to a boundary of the interconnect substrate.

According to this feature, the same devices can be electrically connected to the same second lower layer land section through the shortest route.

(48) This method of manufacturing a semiconductor device may further comprise a step of disposing the first land sections inside the mounting region by bending the interconnect substrate.

According to this method, since the first land sections are disposed inside the mounting region, a semiconductor device approximately as small as the semiconductor chips can be manufactured.

BRIEF DESCRIPTION OF THE DRAWINGS

FIG. 16 is a view showing an interconnect substrate according to a third embodiment to which the present invention is applied.

BEST MODE FOR CARRYING OUT THE INVENTION

Embodiments of the present invention are described below with reference to the drawings.

First Embodiment

Figure 1:
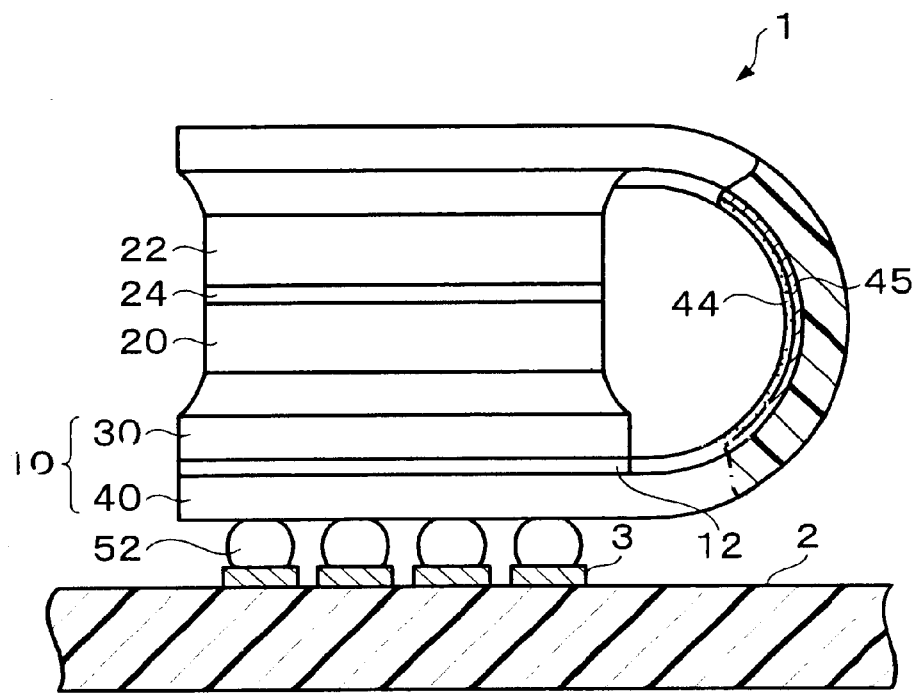
FIG. 1 is a view showing a semiconductor device according to a first embodiment to which the present invention is applied.

FIG. 1 is a view showing a semiconductor device according to a first embodiment to which the present invention is applied. In FIG. 1, a semiconductor device 1 is mounted on a circuit board 2. An organic substrate such as a glass epoxy substrate is generally used as the circuit board 2, for example. An interconnect pattern 3 formed of copper, for example, is formed on the circuit board 2 so as to form a desired circuit. Electrical connection between the interconnect pattern 3 and the semiconductor device 1 is established by connecting the interconnect pattern 3 to external terminals 52 of the semiconductor device 1.

The semiconductor device 1 includes an interconnect substrate 10 and a plurality of semiconductor chips 20 and 22. The interconnect substrate 10 may be used as an interposer for the semiconductor device 1. The interconnect substrate 10 includes an upper substrate 30 and a lower substrate 40. A first semiconductor chip 20 is mounted on the upper substrate 30. A second semiconductor chip 22 is mounted on the lower substrate 40. The semiconductor chips 20 and 20 are layered by bending at least the lower substrate 40 of the interconnect substrate 10. The surface of the first semiconductor chip 20 opposite to the surface to which the upper substrate 30 is adhered is adhered to the surface of the second semiconductor chip 22 opposite to the surface to which the lower substrate 40 is adhered, using an adhesive 24 or the like, for example.

Figure 2:
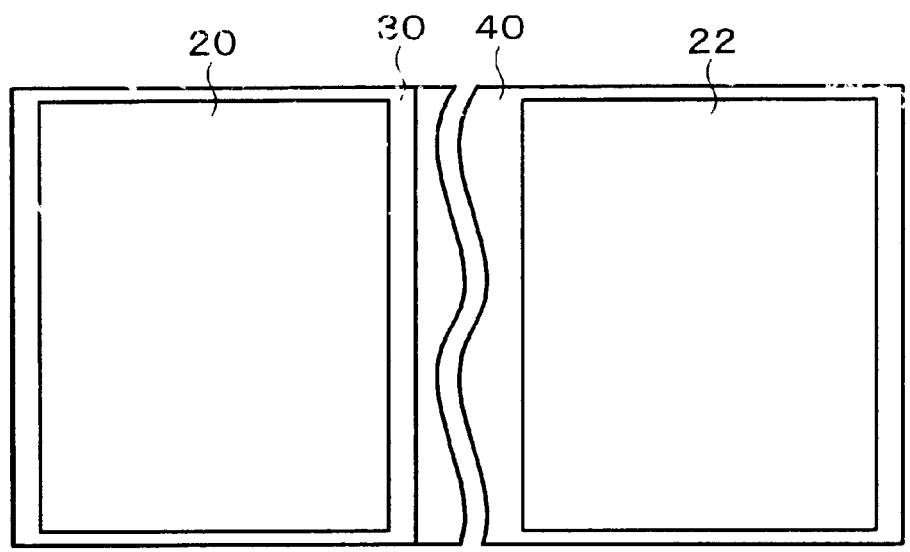
FIG. 2 is a view showing the semiconductor device according to the first embodiment to which the present invention is applied.

FIG. 2 is a view showing the interconnect substrate 10 (which is bent in FIG. 1) straightened to fall in one plane. The interconnect substrate 10 consists of a plurality of layered substrates. The interconnect substrate 10 shown in FIG. 2 is formed by adhering the upper substrate 30 to the lower substrate 40. The lower substrate 40 and the upper substrate 30 may be adhered using an adhesive 12, as shown in FIG. 1. In FIG. 2, the entire surface of the upper substrate 30 is adhered to part of the lower substrate 40. Specifically, the planar configuration of the lower substrate 40 is greater than that of the upper substrate 30. Part of the upper substrate 30 may be adhered to part of the lower substrate 40. In addition, at least one substrate may be adhered to either the upper surface of the upper substrate 30 or the lower surface of the lower substrate 40.

The upper substrate 30 and the lower substrate 40 may be formed of either the same material or different materials. As examples of the upper substrate 30 and the lower substrate 30, 40 formed of organic materials, a flexible substrate formed of a polyimide resin and the like can be given. A tape used in TAB technology may be used as the flexible substrate. It is preferable that the upper substrate 30 and the lower substrate 30 be flexible substrates when these substrates are bent. The upper substrate 30 and the lower substrate 40 may be formed of inorganic materials. A ceramic substrate and a glass substrate are given as examples. The upper substrate 30 and the lower substrate 40 may be formed of organic/inorganic composite materials. A glass epoxy substrate is given as an example. The upper substrate 30 and the lower substrate 40 may have either the same or different thicknesses.

Figure 3:
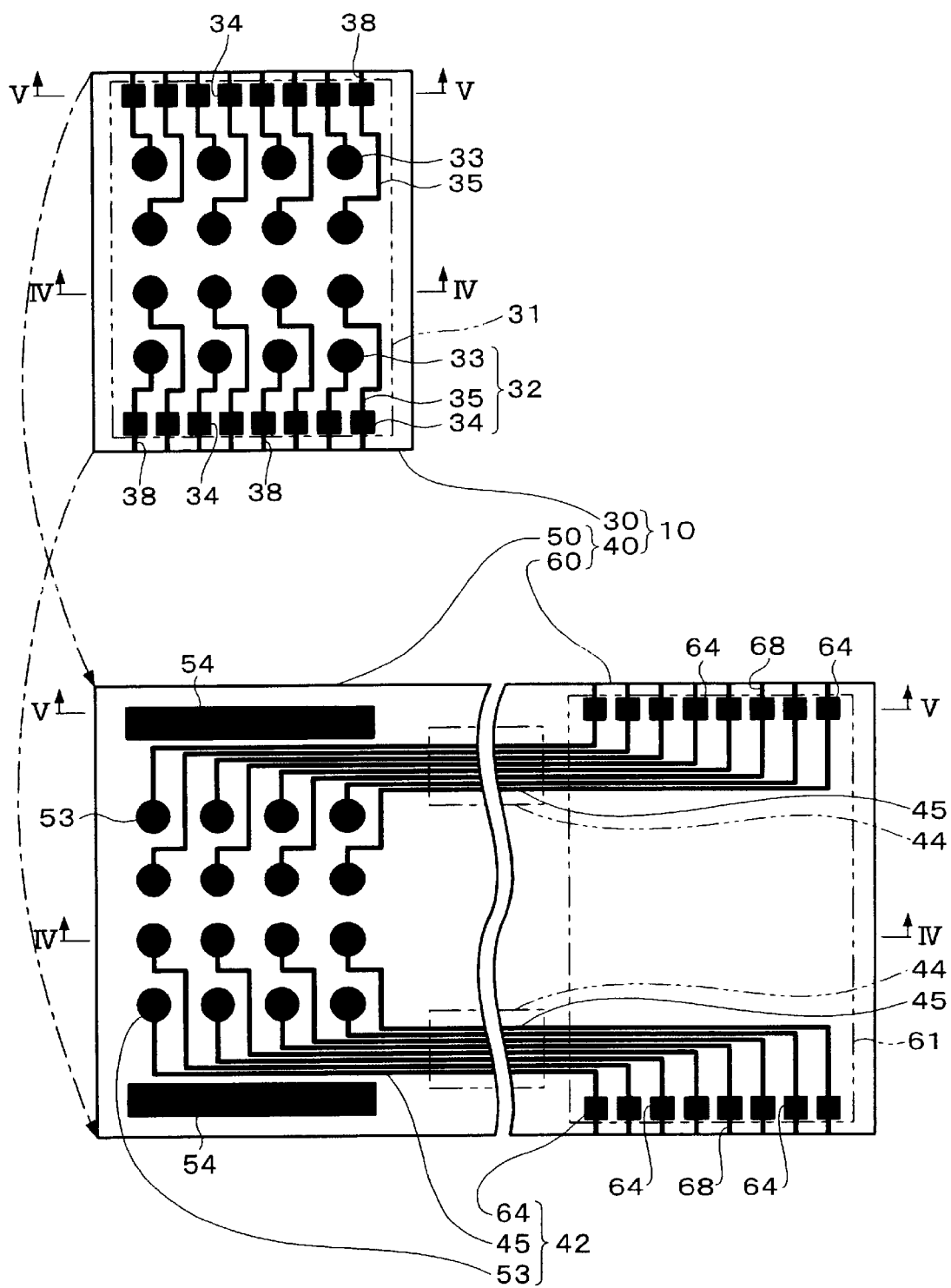
FIG. 3 is a view showing an interconnect substrate according to the first embodiment to which the present invention is applied.

FIG. 3 is a view showing the planar configuration of each of the upper substrate 30 and the lower substrate 40 which are shown in FIG. 2. There are no specific limitations to the planar configuration of the upper substrate 30 and the lower substrate 40. The upper substrate 30 and the lower substrate 40 are rectangular in many cases.

The upper substrate 30 has a mounting region 31 for a first electronic chip (semiconductor chip 20) on one surface. An upper interconnect pattern 32 is formed on the upper substrate 30. The upper interconnect pattern 32 is formed on one surface of the upper substrate 30.

The upper interconnect pattern 32 may be formed of conductive materials such as copper. The upper interconnect pattern 32 may be adhered to the upper substrate 30 through an adhesive (not shown), thereby forming a three-layer substrate. The upper interconnect pattern 32 may be formed on the upper substrate 30 without using an adhesive, thereby forming a two-layer substrate.

The upper interconnect pattern 32 includes a plurality of first upper land sections 33, a plurality of second upper land sections 34, and a plurality of upper connection sections 35.

Figure 4:
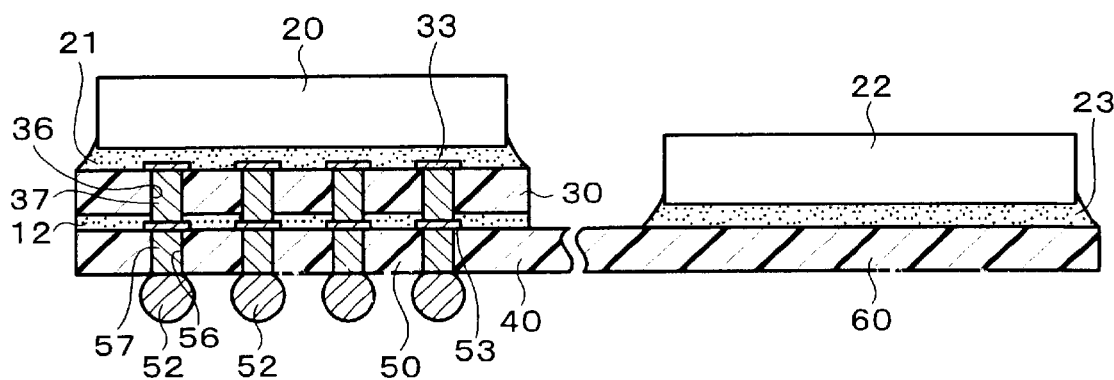
FIG. 4 is a view showing a cross section of the semiconductor device according to the first embodiment to which the present invention is applied.

The first upper land sections 33 are formed in the center portion (area excluding the end portions) of the upper substrate 30. The first upper land sections 33 may be formed in the mounting region 31 for the semiconductor chip 20. A plurality of through-holes 36 are formed in the upper substrate 30, as shown in FIG. 4. The first upper land sections 33 are formed on each through-hole 36. Each through-hole 36 is filled with a conductive material 37 such as copper or solder. The first upper land sections 33 are electrically connected to a lower interconnect pattern 42 of the lower substrate 40 through the conductive material 37. Specifically, the through-holes 37 are formed on first lower land sections 53 of the lower interconnect pattern 42 of the lower substrate 40. The first upper land sections 33 are electrically connected to the first lower land sections 53 through the conductive material 37.

An opening may be formed in the first lower land sections 53. The first upper land sections 33 may be connected to the first lower land sections 53 at the time of forming external terminals 52, as described later, using solder cream, solder balls, or conductive paste for forming the external terminals 52, for example. Both surfaces of the upper substrate 30 may be electrically connected by plating the through-holes 36 with the conductive material 37 such as copper, thereby forming through-holes.

The second upper land sections 34 are formed in the end portions of the upper substrate 30. In the example shown in FIG. 3, the second upper land sections 34 are formed in the two parallel end portions of the upper substrate 30. The second upper land sections 34 may be formed in all four end portions of the upper substrate 30. The second upper land sections 34 are used for electrical connection with the first electronic chip (semiconductor chip 20). In the case where the semiconductor chip 20 is bonded face down, the second upper land sections 34 are located inside the mounting region 31. In the case where the semiconductor chip 20 is bonded face up, the second upper land sections 34 may be located outside the mounting region 31.

Note that plated leads 38 may remain from the second upper land sections 34 toward the edges. The plated leads 38 are used to electrically connect the areas of the upper interconnect pattern 32 which are not already electrically connected, in order to simultaneously electroplate the upper interconnect pattern 32 formed on a substrate greater than the upper substrate 30. When the upper substrate 30 is obtained by punching the substrate out into individual pieces after electroplating, part of the plated leads 38 remains on the upper substrate 30. The end of the plated leads 38 is exposed from the end of the upper substrate 30. The upper interconnect pattern 32 may be provided with electroless plating without forming the plated leads 38. This also applies to the lower interconnect pattern 42.

The upper connection sections 35 electrically connect at least one (only one in many cases) of the first upper land sections 33 to at least one (only one in many cases) of the second upper land sections 34. In the example shown in FIG. 3, the upper connection sections 35 are formed inside the mounting region 31.

The lower substrate 40 has first and second regions 50 and 60 on one surface. In the example shown in FIG. 3, the lower substrate 40 is rectangular. A pair of parallel sides of the rectangle among the four sides is formed by the continuous end portions of the first and second regions 50 and 60. One of the other pair of parallel sides is formed by the end portion of the first region 50, and the other is formed by the end portion of the second region 60.

The upper substrate 30 is adhered in the first region 50. The second region 60 includes a mounting region 61 for a second electronic chip (semiconductor chip 22). A lower interconnect pattern 42 is formed on the lower substrate 40. The lower interconnect pattern 42 is formed on one surface of the lower substrate 40.

The lower interconnect pattern 42 may be formed of a conductive material such as copper. The lower interconnect pattern 42 may be adhered to the lower substrate 40 through an adhesive (not shown), thereby forming a three-layer substrate. The lower interconnect pattern 42 may be formed on the lower substrate 40 without using an adhesive, thereby forming a two-layer substrate.

The lower interconnect pattern 42 includes a plurality of first lower land sections 53, a plurality of second lower land sections 64, and a plurality of lower connection sections 45.

The first lower land sections 53 are formed in the center portion (area excluding the end portions) of the first region 50 of the lower substrate 40. The first lower land sections 53 are electrically connected to the first upper land sections 33 of the upper substrate 30.

A plurality of through-holes 56 are formed in the first region 50 of the lower substrate 40, as shown in FIG. 4. The first lower land sections 53 are formed on the through-holes 56. Each through-hole 56 is filled with a conductive material 57 in order to achieve electrical connection with the external terminals 52. Both surfaces of the lower substrate 40 may be electrically connected by plating the through-holes 56 with the conductive material 57 such as copper, thereby forming through-holes.

The second lower land sections 64 are formed in the end portions of the second region 60 of the lower substrate 40. In the example shown in FIG. 3, the second lower land sections 64 are formed in a pair of parallel end portions of the second region 60 which form a pair of parallel sides of the lower substrate 40 continuously with a pair of parallel end portions of the first region 50.

The second lower land sections 64 are used for electrical connection with the second electronic chip (semiconductor chip 22). In the case where the semiconductor chip 22 is bonded face down, the second lower land sections 64 are located inside the mounting region 61. In the case where the semiconductor chip 22 is bonded face up, the second lower land sections 64 may be located outside the mounting region 61.

Note that plated leads 68 may remain from the second lower land sections 64 toward the edges. The plated leads 68 are used to electrically connect the areas of the lower interconnect pattern 42 which are not already electrically connected, in order to simultaneously electroplate the lower interconnect pattern 42 formed on a substrate greater than the lower substrate 40. When the lower substrate 40 is obtained by punching the substrate out into individual pieces after electroplating, part of the plated leads 68 remains on the lower substrate 40.

The lower connection sections 45 electrically connect at least one (only one in many cases) of the first lower land sections 53 to at least one (only one in many cases) of the second lower land sections 64.

The lower connection sections 45 are formed so as to run outside the first lower land section 53 in the first region 50. Specifically, the first lower land sections 53 are formed in the center portion (area excluding the end portions) of the first region 50, and the lower connection sections 45 are formed outside the center portion (but inside the end portions). In the example shown in FIG. 3, the lower connection sections 45 run between a pair of parallel end portions of the first region 50 continuous with a pair of parallel end portions of the second region 60 and the region (center portion) in which the first lower land sections 53 are formed.

The lower connection sections 45 are formed closer to the center portion than the second lower land sections 64 in the second region 60. Specifically, the second, lower land sections 64 are formed closer to the center portion than the pair of parallel end portions of the second region 60 continuous with the pair of parallel end portions of the first region 50. According to this configuration, since the lower connection sections 45 run closer to the center portion than the second lower land sections 64, the lower connection sections 45 can be formed without increasing the area of the lower substrate 40.

It is preferable that the lower connection sections 45 be covered with insulating layers 44 such as resists. For example, the insulating layers 44 are formed on the lower connection sections 45 across the first and second regions 50 and 60. In the case where the lower substrate 40 is bent, as shown in FIG. 1, it is preferable that the lower connection sections 45 be covered with the insulating layers 44 at least in the bent section. The insulating layers 44 may be formed using solder resist materials and the like. The region greater than the region shown in FIG. 1 excluding the second lower land sections 64 and the first lower land sections 53 may be covered with the insulating layers 44. This prevents occurrence of short circuits between the lower connection sections 45 or between the interconnect patterns due to adhesion of conductive foreign matter, for example.

Dummy patterns 54 may be formed in the pair of parallel end portions of the first region 50 of the lower substrate 40 continuous with the pair of parallel end portions of the second region 60. In the case where the dummy patterns 54 are formed using conductive materials, it is preferable that the dummy patterns 54 be electrically insulated from the lower interconnect pattern 42. The dummy patterns 54 formed using conductive materials may be electrically connected to part of the lower interconnect pattern 42 insofar as the dummy patterns do not cause short circuits in the nonconductive area of the lower interconnect pattern 42. It is preferable that the dummy patterns 54 be formed to have the same thickness as the lower interconnect pattern 42. This allows the height of the upper surface of the dummy patterns 54 to be approximately the same as that of the upper surface of the lower interconnect pattern 42. As a result, the surface of the first region 50 of the lower substrate 40 to which the upper substrate 30 is adhered is planarized, whereby the upper substrate 30 can be stably adhered. The dummy patterns 54 may be formed using the same material as for the lower interconnect pattern 42.

Moreover, in the case of manufacturing a semiconductor device by mounting the semiconductor chip 20 on the upper substrate 30 after adhering the upper substrate 30 to the lower substrate 40, since the flatness of electrodes 26 can be ensured, the semiconductor chip 20 can be mounted with high reliability.

Figure 5:
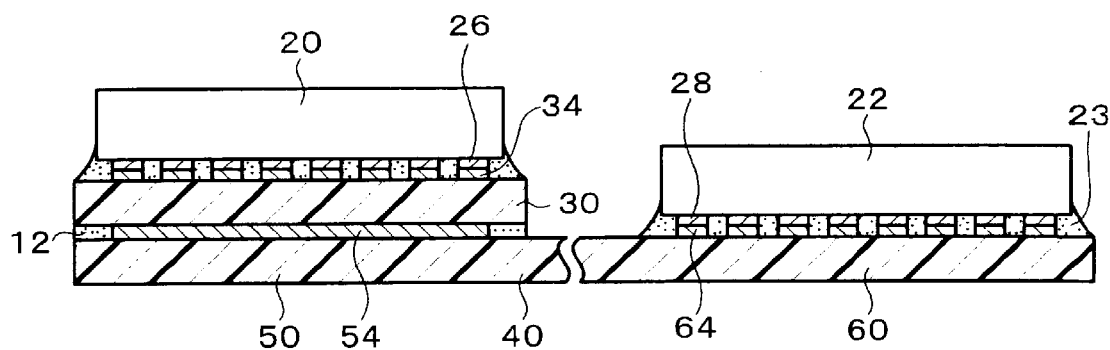
FIG. 5 is a view showing a cross section of the semiconductor device according to the first embodiment to which the present invention is applied.
Figure 6:
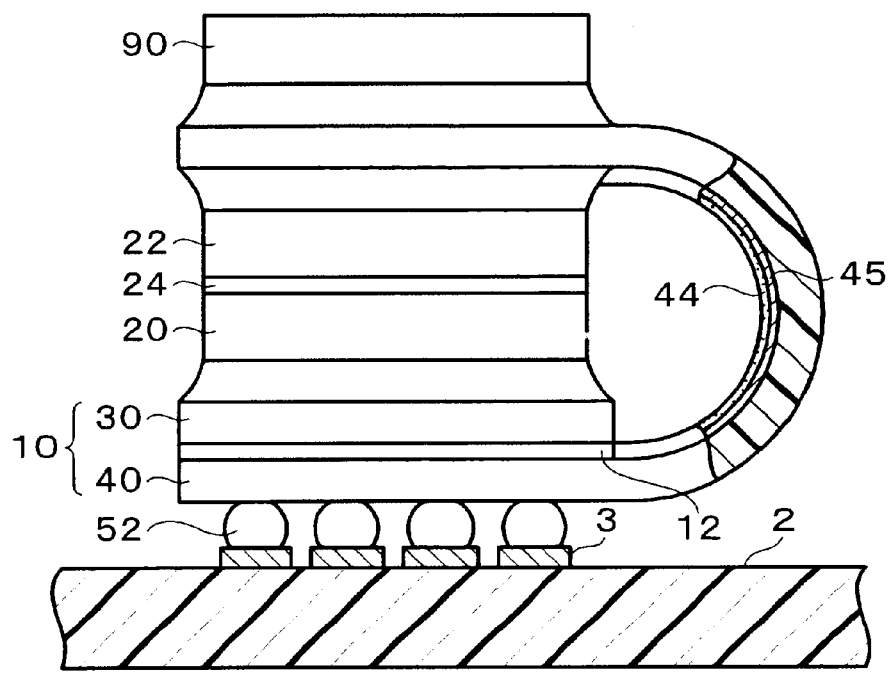
FIG. 6 is a view showing a semiconductor device according to a modification example of the first embodiment to which the present invention is applied.

FIGS. 4 and 5 are cross-sectional views showing the semiconductor device illustrated in FIG. 2 in which the lower substrate 40 is straightened in a plane. In FIG. 4, the upper substrate 30 and the lower substrate 40 are shown by the cross sections along the line IV—IV shown in FIG. 3. In FIG. 5, the upper substrate 30 and the lower substrate 40 are shown by the cross sections along the line V—V shown in FIG. 3.

The surface of the upper substrate 30 opposite to the surface on which the upper interconnect pattern 32 is formed and the surface of the lower substrate 40 on which the lower interconnect pattern 42 is formed are adhered using the adhesive 12 or the like. The upper substrate 30 is adhered to the first region 50 of the lower substrate 40.

The upper substrate 30 is interposed between the first upper land sections 33 of the upper interconnect pattern 32 and the first lower land sections 53 of the lower interconnect pattern 42. Electrical connection between the first upper land sections 33 and the first lower land sections 53 is established by the conductive material 37 provided in the through-holes 36 formed in the upper substrate 30. As the precondition therefor, the first upper land sections 33 and the first lower land sections 53 preferably have the same arrangement pattern.

The second upper land sections 34 are located above the dummy patterns 54 formed in the first region 50 of the lower substrate 40. The dummy patterns 54 are formed in the end portions of the first region 50 of the lower substrate 40, which are a pair of parallel end portions continuous with the second region 60.

A plurality of the second upper land sections 34 and a plurality of the second lower land sections 64 are formed in the same arrangement pattern. This enables the semiconductor chips 20 and 22 with the same electrode arrangement to be used. In the example shown in FIG. 3, the second upper land sections 34 are formed in the pair of parallel end portions of the upper substrate 30, and the second lower land sections 64 are formed in the p air of parallel end portions of the second region 60 of the lower substrate 40. In the example shown in FIG. 3, the number of the second upper land sections 34 formed in one end portion of the upper substrate 30 and the number of the second lower land sections 64 formed in one end portion of the second region 60 of the lower substrate 40 are the same.

In the present embodiment, one of the first upper land sections 33 is electrically connected to one of the first lower land sections 53. One of the first upper land sections 33 and one of the first lower land sections 53 which are electrically connected are electrically connected to one of the second upper land sections 34 and one of the second lower land sections 64 located in the same arrangement pattern.

In the arrangement pattern shown in FIG. 3, for example, the second upper land section 34 located on the upper left end of the upper substrate 30 and the second lower land section 64 located on the upper left end of the second region 60 of the lower substrate 40 are electrically connected to the first upper land section 33 and the first lower land section 53 located on the upper left end.

In the present embodiment, the second upper land section 34 and the second lower land section 64 electrically connected to the first upper land section 33 and the first lower land section 53 which are electrically connected are formed at the same position in the same arrangement pattern. Therefore, in the case where the semiconductor chips 20 and 22 have the same internal structure, the same devices can be electrically connected from the same first lower land section 53 (external terminal 52). In the case where the semiconductor chips 20 and 22 are used as memories, for example, information can be read out from or written into memory cells of each memory at the same address from the same first lower land section 53 (external terminal 52). A plurality (two, for example) of semiconductor chips can be separately controlled using the same external terminal arrangement by separating the semiconductor chips 20 and 22 merely by the connection of a chip-select terminal.

The semiconductor chip 20 is mounted on the upper substrate 30. In the case where the semiconductor chip 20 is bonded face down, the semiconductor chip 20 may be adhered to the upper substrate 30 using the adhesive 21 or the like. A plurality of the electrodes 26 of the semiconductor chip 20 are electrically connected to the second upper land sections 34. The electrodes 26 may be electrically connected to the second upper land sections 34 using conductive members or a method of diffusing the materials using supersonic waves, heat, or the like. As the conductive members, solder, anisotropic conductive film, anisotropic conductive adhesive, conductive paste, conductive adhesive, and the like can be used. The anisotropic conductive film may be formed by dispersing. conductive particles in the adhesive 21. Brazing such as soldering can be given as examples of a method of electrical connection using the conductive members.

The semiconductor chip 22 is mounted on the lower substrate 40. In the case where the semiconductor chip 22 is bonded face down, the semiconductor chip 22 may be adhered to the lower substrate 40 using the adhesive 23 or the like. A plurality of the electrodes 28 of the semiconductor chip 22 are electrically connected to the second lower land sections 64. The electrodes 28 may be electrically connected to the second lower land sections 64 using the same method used to electrically connect the electrodes 26 to the second upper land sections 34.

The semiconductor chip 22 may be die-attached face up to the lower substrate 40 and mounted by wire bonding. Face up bonding and face down bonding may be used in combination for mounting the semiconductor chips 20 and 22.

The adhesive 23 used for adhering the semiconductor chip 22 to the lower substrate 40 and the adhesive 12 used for adhering the upper substrate 30 to the lower substrate 40 may be continuously formed on the lower substrate 40 using the same material.

As a modification example of the present embodiment, in addition to the above-described example, a semiconductor chip 90 (third semiconductor chip) may be mounted on the surface of the lower substrate 40 opposite to the surface on which the semiconductor chip 22 (second semiconductor chip) is mounted. According to this configuration, since the-semiconductor chips 22 and 90 are mounted on opposite surfaces of the lower substrate 40, a high-density semiconductor device can be provided by effectively using the area of the semiconductor device. The semiconductor chip 90 is mounted so as to be superposed on the semiconductor chip with the lower substrate 40 interposed therebetween. The semiconductor chip 90 may be mounted on the surface of the lower substrate 40 opposite to the lower interconnect pattern 42.

One or more holes (not shown) may be formed in the second region 64 of the lower substrate 40. The semiconductor chip 90 is electrically connected to the second lower land sections 64 of the lower interconnect pattern 42 through the holes formed in the lower substrate 40. A plurality of these holes may be formed at each position corresponding to each second lower land section 64. The holes formed in the lower substrate 40 may be filled with a conductive material. Through-holes maybe formed by forming the conductive material on the inner surface of the holes.

The holes formed in the lower substrate 40 may be slits (not shown). Long, narrow slits are formed. The second lower land sections 64 are formed on the slits by forming part of the lower interconnect pattern 42 across the slits in the direction of the width. Two or more second lower land sections 64 may be formed on one slit. For example, slits may be formed under the second lower land sections 64 arranged in the end portions of a pair of, parallel end portions of-the second region 60, thereby exposing a group of the second lower land sections 64 formed in each end portion. According to this configuration, the second lower land sections 64 can be exposed on both surfaces of the lower substrate 40 merely by forming the slits.

The semiconductor chips 22 and 90 (second and third semiconductor chips) may have a mirror-symmetrical circuit structure with respect to the boundary of the lower substrate 40. According to this configuration, the same devices can be electrically connected to the same second lower land section 64 through the shortest route. In the case where the semiconductor chips 22 and 90 are used as memories, for example, information can be read out from or written in to memory cells of each memory at the same address through the same second lower land section 64. Moreover, a plurality (two, for example) of semiconductor chips 22 and 90 may be separately controlled using the same external terminal arrangement by separating the semiconductor chips 22 and 90 merely by connection of a chip-select terminal.

The semiconductor chip 90 may be mounted on the lower substrate 40 in the same manner as in the case of mounting the semiconductor chip 22 to the lower substrate 40. The present modification example includes contents of an embodiment of holes (slits 182) to be described later as far as possible.

According to the present embodiment, the semiconductor chip 20 is mounted on the upper substrate 30. Therefore, it is unnecessary to form the lower connection sections 45 for electrically connecting other semiconductor chip 22 to the external terminals 52 so as to avoid the second upper land sections 34, whereby the lower connection sections 45 can be formed through the shortest route. Since the lower connection sections 45 run outside the first lower land sections 53, space can be effectively used. The lower connection sections 45 run between the first lower land sections 53 only in the area in which the first lower land sections 53 are connected to the outside. Therefore, part of the lower connection sections 45 which takes a roundabout route in order to avoid the first lower land sections 53 can be decreased to a minimum. According to the present embodiment, the interconnect length can be decreased as described above, whereby the electrical characteristics of the semiconductor device can be remarkably improved.

Manufacture Method for Semiconductor Device

The present embodiment is constituted as described above. The method of manufacturing a semiconductor device using the interconnect substrate 10 includes a step of mounting the semiconductor chip 20 on the upper substrate 30 of the interconnect substrate 10, and mounting the semiconductor chip on the lower substrate 40 of the interconnect substrate 10. The semiconductor chip 90 may be mounted on the surface of the lower substrate 40 opposite to the semiconductor chip 22. The semiconductor chip 90 is electrically connected to the lower interconnect pattern 42 through the holes (slits, for example) formed in the lower substrate 40. The semiconductor chips 20, 22, and 90 may be layered by bending at least
the lower substrate 40.

Manufacture Method for Interconnect Substrate

FIGS. 7 to 13 are views showing a method of manufacturing the interconnect substrate according to the present embodiment.

FIRST EXAMPLE

Figure 7:
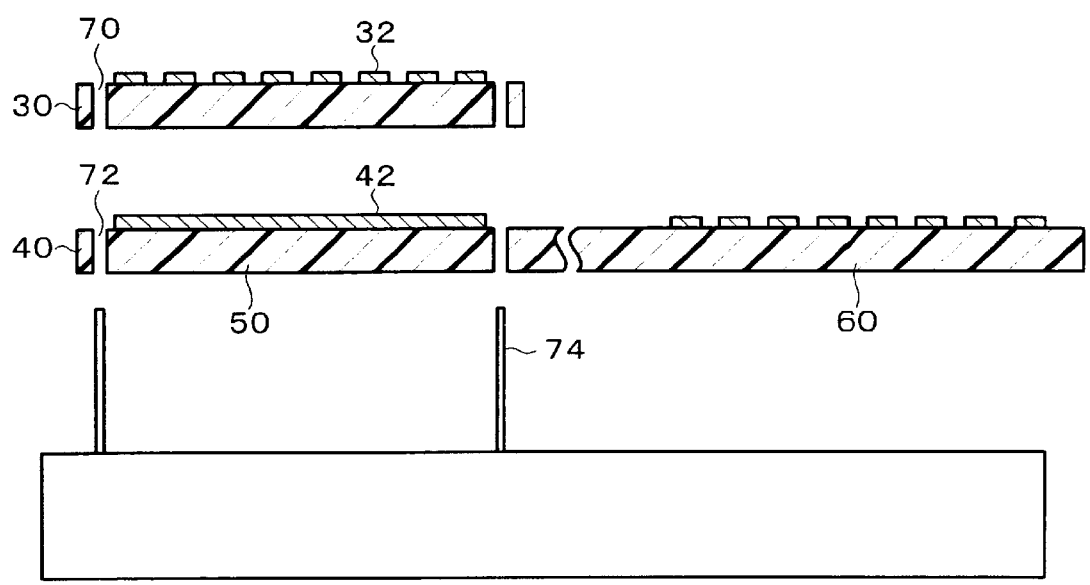
FIG. 7 is a view showing a first example of a method of manufacturing the interconnect substrate according to the first embodiment to which the present invention is applied.

FIG. 7 is a view showing a first example of the method of manufacturing the interconnect substrate according to an embodiment to which the present invention is applied. In this example, the upper substrate 30 and the lower substrate 40 are provided. The upper substrate 30 and the lower substrate 40 may be formed by punching out a flexible substrate. The flexible substrate may be a flexible tape substrate. The flexible substrate may be punched out after forming the upper layer and lower interconnect patterns 32 and 42, through-holes 36 and 56, and the like on the flexible substrate in advance.

In the case of forming the lower substrate 40 by punching out the flexible substrate, the flexible substrate may be punched out after adhering the upper substrate 30 to the flexible substrate.

Then, a step of adhering at least part of the upper substrate 30 to the first region 50 of the lower substrate 40, and a step of electrically connecting the upper and lower interconnect patterns 32 and 42 are carried out.

It is preferable to position the upper substrate 30 and the lower substrate 40 before the adhering step or as part of the adhering step. For example, positioning holes 70 and 72 which link together when positioned may be respectively formed in the upper substrate 30 and the lower substrate 40, as shown in FIG. 7. The upper substrate 30 and the lower substrate 40 may be positioned by inserting jigs 74 such as pins in the holes.

Part of the electrical connection step may be carried out by the adhering step. For example, the conductive material 37 is provided in the through-holes 36 formed in the upper substrate 30 before the adhering step. Solder, high-temperature solder, cream solder, or the like can be used as the conductive material 37. At least part of the electrical connection step may be carried out by allowing the conductive material 37 to be in contact with the first lower land sections 53 when adhering the upper substrate 30 to the lower substrate 40 in adhering the step.

In the case where the conductive material 37 is soft, the through-holes 36 are filled with the conductive material 37 to an extent that the conductive material 37 overflows the surface of the upper substrate 30 or the adhesive 12 if it is provided. This enables the first upper land sections 33 and the first lower land sections 53 to be electrically connected by the adhering step.

In the case where the conductive material 37 is cured at room temperature, the conductive material 37 is melted by heating after the adhering step, thereby electrically connecting the first upper land section 33 to the first lower land section 53. Heating may be carried out when forming the external terminals 52 or in a reflow step for mounting the semiconductor device to the circuit board.

SECOND EXAMPLE

Figure 8:
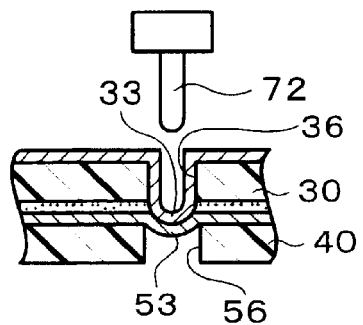
FIG. 8 is a view showing a second example of the method of manufacturing the interconnect substrate according to the first embodiment to which the present invention is applied.

FIG. 8 is a view showing a second example of the method of manufacturing the interconnect substrate according to an embodiment to which the present invention is applied. In this example, part of the first upper land section 33 is pressed into the through-hole 36 using a convex mold 72. The first upper land section 33 can be electrically connected to the first lower land section 53 by bending the first upper land section 33 in this manner.

The first upper land sections 33 and the first lower land sections 53 can be easily electrically connected by heating and applying pressure, or applying supersonic waves and applying pressure using the convex mold 72. These also apply to third to sixth examples described below.

THIRD EXAMPLE

Figure 9:
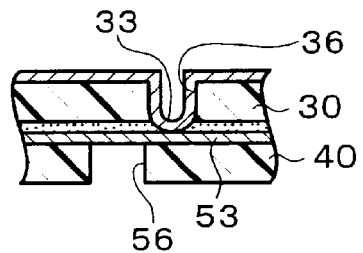
FIG. 9 is a view showing a third example of the method of manufacturing the interconnect substrate according to the first embodiment to which the present invention is applied.

FIG. 9 is a view showing a third example of the method of manufacturing the interconnect substrate according to an embodiment to which the present invention is applied. This example is the same as the second example except f or the position of the through-hole 56 formed in the lower substrate 40. As shown in FIG. 9, the position of the through-hole 56 formed in the lower substrate 40 may deviate from the position of the through-hole 36 formed in the upper substrate 30.

FOURTH EXAMPLE

Figure 10:
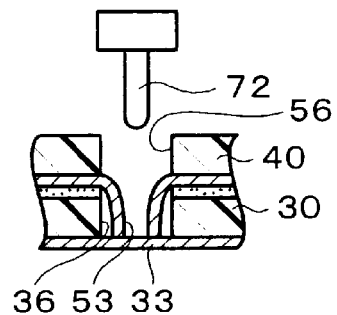
FIG. 10 is a view showing a fourth example of the method of manufacturing the interconnect substrate according to the first embodiment to which the present invention is applied.

FIG. 10 is a view showing a fourth example of the method of manufacturing the interconnect substrate according to an embodiment to which the present invention is applied. In this example, part of the lower interconnect pattern 42 is pressed into the through-hole 36 formed in the upper substrate 30 using the convex mold 72. When carrying out this step, it is preferable that the through-hole 56 formed in the lower substrate 40 and the through-hole 36 formed in the upper substrate 30 be formed at a position so as to interlink.

The first upper land section 33 can be electrically connected to the first lower land section 53 by bending the first lower land section 53 in this manner.

FIFTH EXAMPLE

Figure 11:
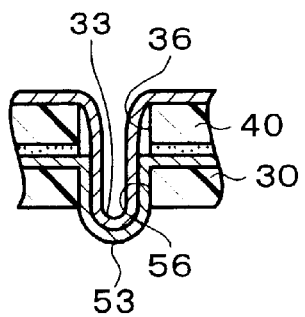
FIG. 11 is a view showing a fifth example of the method of manufacturing the interconnect substrate according to the first embodiment to which the present invention is applied.

FIG. 11 is a view showing a fifth example of the method of manufacturing the interconnect substrate according to an embodiment to which the present invention is applied. In this example, part of the first upper land section 33 is pressed into the through-hole 36 using the convex mold 72 shown in FIG. 8, and the first lower land section 53 is pushed into the through-hole 56. The external terminals can be formed by the first upper land section 33 and the first lower land section 53 in this manner. In the case of the external terminals projecting from the lower substrate 40, part of the first lower land section 53 projects from the lower substrate 40.

SIXTH EXAMPLE

Figure 12:
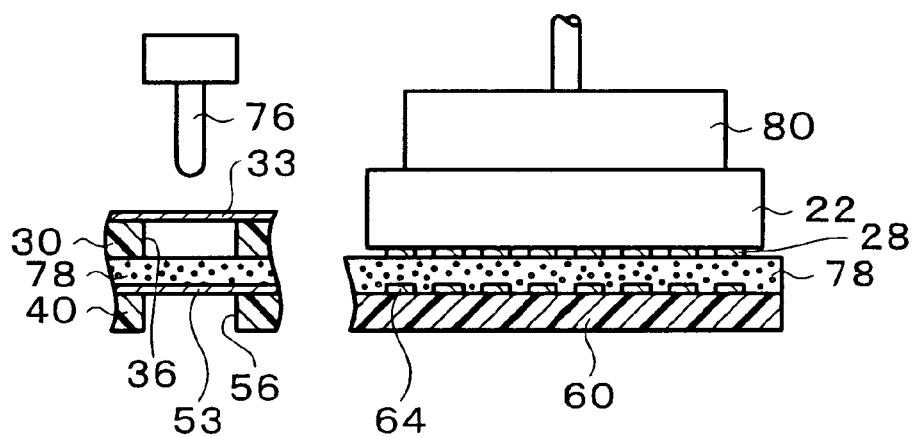
FIG. 12 is a view showing a sixth example of the method of manufacturing the interconnect substrate according to the first embodiment to which the present invention is applied.

FIG. 12 is a view showing a sixth example of the method of manufacturing the interconnect substrate according to an embodiment to which the present invention is applied. In this example, an anisotropic conductive film 78 is used in the step of adhering the upper substrate 30 and the lower substrate 40. Specifically, the upper substrate 30 is adhered to the lower substrate 40 with the anisotropic conductive film 78 interposed therebetween. The anisotropic conductive film 78 may be a tape or sheet anisotropic conductive material or a liquid anisotropic conductive material applied to at least one of the upper substrate 30 and lower substrate 40. The anisotropic conductive material is prepared by dispersing conductive particles in an adhesive. The surface of the upper substrate 30 opposite to the surface on which the upper interconnect pattern 32 is formed is adhered to the surface of the lower substrate 40 on which the lower interconnect pattern 42 is formed.

Manufacture Method for Semiconductor Device to Which Sixth Example is Applied

In the case where the anisotropic conductive film 72 is provided on the surface of the lower substrate 40 on which the lower interconnect pattern 42 is formed, the semiconductor chip 22 may be bonded face down to the lower substrate 40 through the anisotropic conductive film 72. In this case, it is preferable to provide the anisotropic conductive films 78 both in the mounting region 61 for the semiconductor chip 22 and in the first region 50 of the lower substrate 40 to which the upper substrate 30 is adhered. The adhering step of the upper substrate 30 and the lower substrate 40 and the mounting step of the semiconductor chip 22 may be carried out either simultaneously or consecutively.

According to this configuration, the material f or adhering the upper substrate 30 to the lower substrate 40 and the material for adhering and electrically connecting the semiconductor chip 22 to the lower substrate 40 are the same. Therefore, the number of materials can be decreased.

In the example shown in FIG. 12, the mounting step of the semiconductor chip 22 and the electrical connection step of the first upper land sections 33 and the first lower land sections 53 are carried out after the step of adhering the upper substrate 30 to the lower substrate 40. Specifically, the anisotropic conductive film 78 is interposed between the upper substrate 30 and the lower substrate 40 as shown in FIG. 12. The anisotropic conductive film 78 is also provided in the mounting region 61 for the semiconductor chip 22 of the lower substrate 40.

Pressure is applied to the semiconductor chip 22 and the lower substrate 40 using a press jig 80, whereby the semiconductor chip 22 is bonded face down to the lower substrate 40. Specifically, the mounting step for the semiconductor chip 22 is carried out.

The first upper land sections 33 are electrically connected to the first lower land sections 53 using the convex mold 76 in the same step shown in FIG. 8. Specifically, the connection step is carried out. The external terminals may be formed using the convex mold 76 in the same step shown in FIG. 11. In the present embodiment, since the anisotropic conductive film 78 is interposed between the upper substrate 30 and the lower substrate 40, the upper substrate 30 may be electrically connected to the lower substrate 40 by the conductive particles.

SEVENTH EXAMPLE

Figure 13:
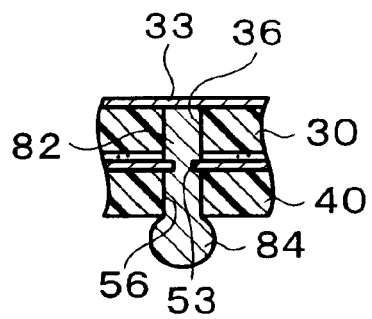
FIG. 13 is a view showing a seventh example of the method of manufacturing the interconnect substrate according to the first embodiment to which the present invention is applied.

FIG. 13 is a view showing a seventh example of the method of manufacturing the interconnect substrate according to an embodiment to which the present invention is applied. In this example, the upper substrate 30 is adhered to the lower substrate 40, and the interlinked through-holes 36 and 56 are filled with a conductive material 82. As the conductive material 82, solder, cream solder, brazing material, conductive paste, or the like can be used. The conductive material 82 is melted by heating or provided with a terminal member such as solder balls, thereby forming an external terminal 84.

A semiconductor device may be manufactured using the interconnect substrate thus obtained. The present embodiment may be applied as part of the manufacture steps of the semiconductor device.

Second Embodiment

Figure 14:
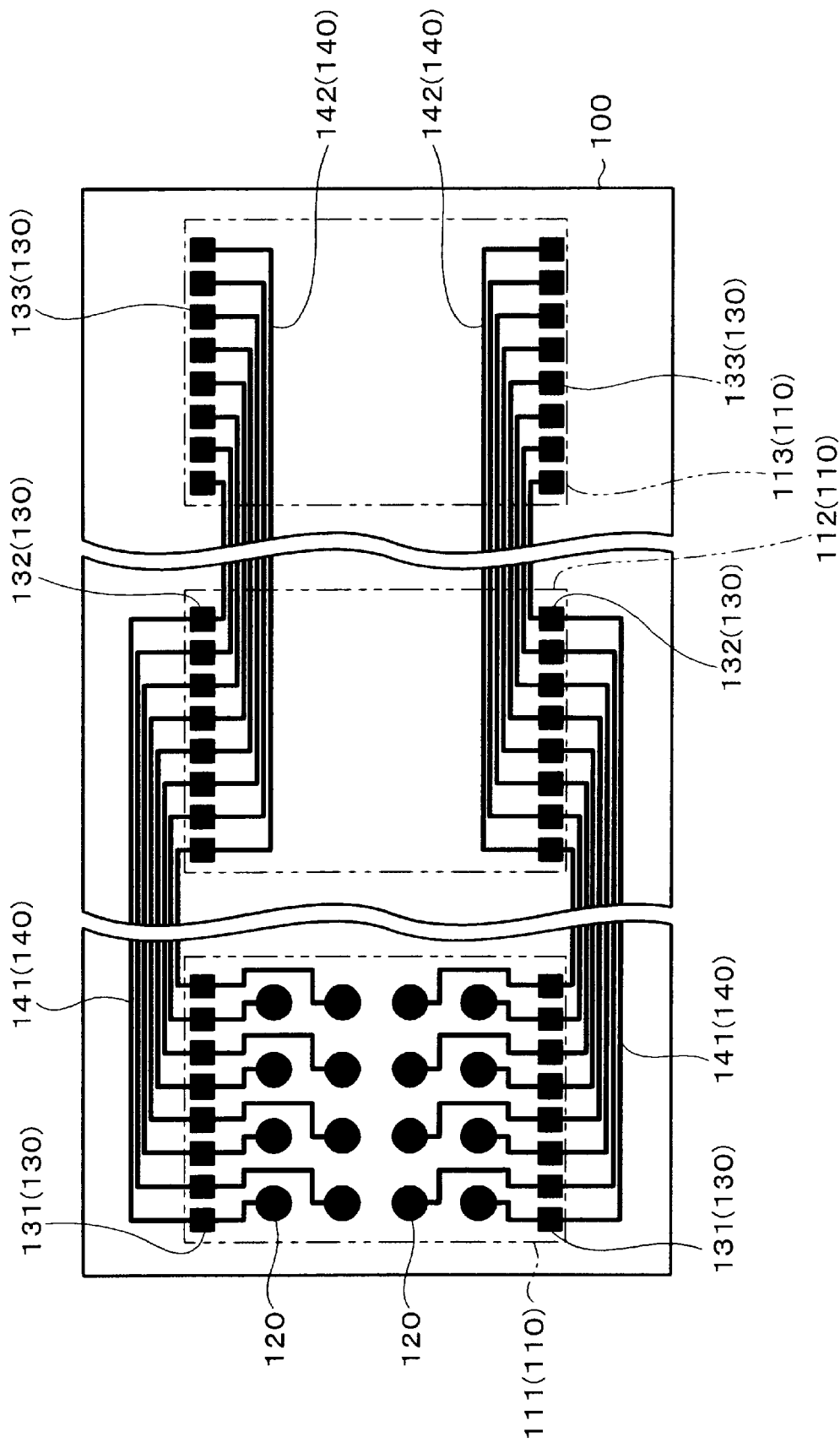
FIG. 14 is a view showing an interconnect substrate according to a second embodiment to which the present invention is applied.

FIG. 14 is a view showing an interconnect substrate according to a second embodiment to which the present invention is applied. An interconnect substrate 100 has a plurality of mounting regions 110 for a plurality of electronic chips such as semiconductor chips. The mounting regions 110 are aligned in one direction. For example, the interconnect substrate 100 is rectangular and a plurality of the regions 110 is arranged along a pair of parallel sides of the rectangle.

In one region 111 located in the end portion of the interconnect substrate 100, a plurality of first land sections 120 for external electrical connection is formed. Throughholes (not shown) are formed under the first land sections 120. External terminals may be provided through these through-holes. The details are the same as described in the first embodiment.

A plurality of second land sections 130 which are electrically connected to electronic chips such as semiconductor chips are formed in each of the mounting regions 110. As the structure and the method of mounting the semiconductor chips to the substrate, those described in the first embodiment can be applied. The second land sections 130 are aligned in the direction in which a plurality of the regions 110 are aligned. For example, the interconnect substrate 100 is rectangular and the second land sections 130 are formed in a row at a position close to one of a pair of parallel sides of the interconnect substrate 100. The second land sections 130 are also formed in a row at a position close to the other of a pair of parallel sides.

Second land sections 131 are formed outside the first land sections 120 in the mounting region 111 in which the first land sections 120 are formed. In the mounting region 111 in which the first land sections 120 are formed, at least one (only one in many cases) of the first land sections 120 is electrically connected to at least one (only one in many cases) of the second land sections 131.

A plurality of connection sections 140 for electrically connecting the second land sections 131 formed in the adjacent mounting regions 110 are formed on the interconnect substrate 100. The connection sections 141 are formed outside the second land sections 130 between the mounting region 111, in which the first land sections 120 are formed, and the mounting region 112 adjacent thereto. The connection sections 142 are formed inside the second land sections 130 between the mounting region 112 at an even-numbered position from the mounting region 111 in which the first land sections 120 are formed and the mounting region 113 at an even-numbered position from the mounting region The connection sections 141 maybe formed inside the second land sections 130 between the mounting region 111 and the mounting region 112 adjacent thereto. The connection sections 142 may be formed outside the second land sections 130 between the mounting region 112 and the mounting region 113 adjacent thereto. This ensures that the size of the interconnect. substrate 100 becomes minimum when two semiconductor chips are mounted.

It is preferable that an insulation film (not shown) be formed on the connection sections 140 at least in the area across two adjacent mounting regions. The details are the same as described in the first embodiment.

A plurality of the second land sections 130 are formed in each region 110 in the same alignment pattern. For example, a plurality of the second land sections 130 are formed in two rows. A pair of second land sections 130 formed at a line-symmetrical position with respect to the boundary between the mounting regions 110 is connected by the connection sections 140 in the adjacent mounting regions. For example, the second land section 131 located on the upper left end of the mounting region 111 and the second land section 132 located on the upper right end of the mounting region 112 adjacent to the mounting region 111 are connected by the connection section 140, as shown in FIG. 14.

According to the present embodiment, since the interconnect pattern, including the first and second land sections 120 and 130 and the connection sections 140, has the above-described configuration, the interconnect length can be decreased. Specifically, since the connection sections 140 do not run between the second land sections 140, the connection sections 140 can be formed through the shortest route. The connection sections 140 are formed outside the second land sections 131 and 132 between the mounting region 111, in which the first land sections 120 are formed, and the region 112 adjacent thereto, whereby the connection sections 141 can be formed by effectively using space. As a result, an increase in the interconnect length can be prevented.

Figure 15:
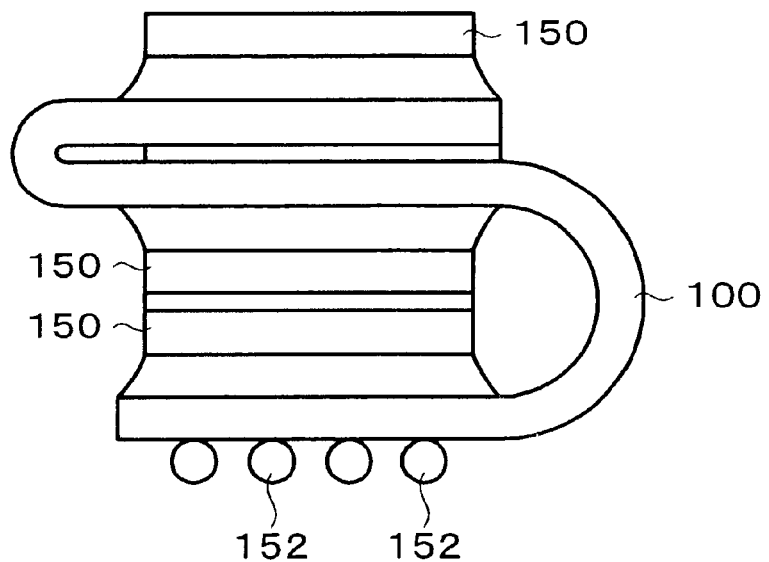
FIG. 15 is a view showing a semiconductor device according to the second embodiment to which the present invention is applied.

FIG. 15 is a view showing a semiconductor device according to the second embodiment to which the present invention is applied. This semiconductor device includes the above-described interconnect substrate 100, semiconductor chips 150 mounted in each mounting region 110, and external terminals 152. A plurality of the semiconductor chips 150 are layered by bending the interconnect substrate 100.

In the interconnect substrate 100, since the second land sections 130 are formed in each mounting region 110 in the same alignment pattern, a plurality of the semiconductor chips 150 with the same electrode pattern can be used. Note that a pair of second land sections 130 formed at a line-symmetrical position with respect to the boundary between the adjacent mounting regions 110 is connected in the adjacent mounting regions 110. Therefore, it is preferable to use the semiconductor chips 150 having a mirror-symmetrical structure (mirror ICs) in the adjacent mounting regions 110. According to this configuration, in the case where the semiconductor chips 150 are memories, for example, memory cells at the same address can be connected by the connection sections 140.

The method of manufacturing a semiconductor device according to the present embodiment includes a step of mounting the semiconductor chips 150 to each mounting region 110 of the interconnect substrate 100. The method may further include a step of layering the semiconductor chips 150 mounted in each mounting region 110 by bending the interconnect substrate 100.

The content described in the first embodiment is applied to the present embodiment as far as possible.

Third Embodiment

Figure 17:
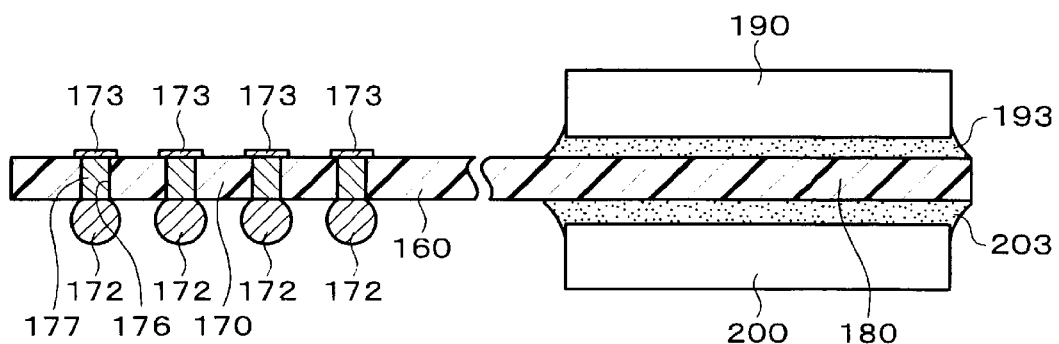
FIG. 17 is a view showing a cross section of a semiconductor device according to the third embodiment to which the present invention is applied.
Figure 18:
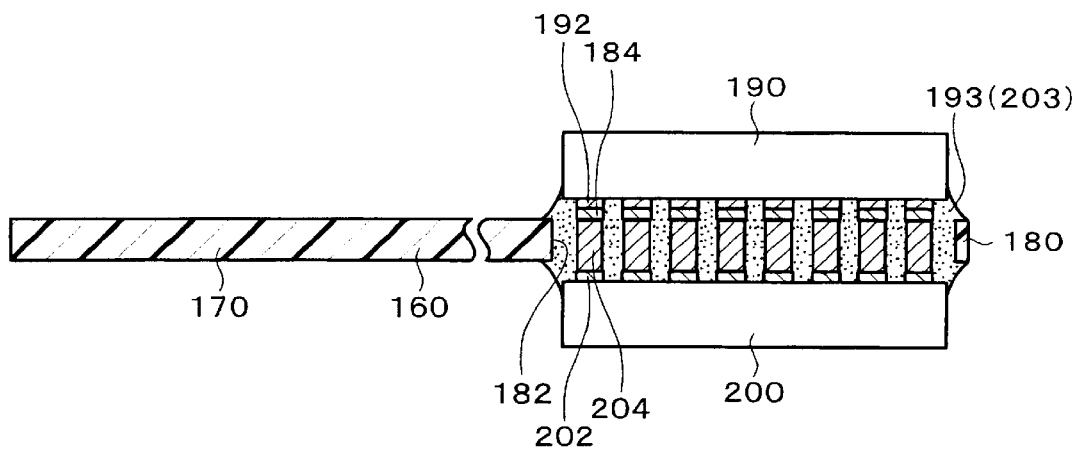
FIG. 18 is a view showing a cross section of the semiconductor device according to the third embodiment to which the present invention is applied.

FIG. 16 is a view showing a planar configuration of an interconnect substrate according to a third embodiment to which the present invention is applied. FIG. 17 is a cross-sectional view along the line XVII—XVII shown in FIG. 16 viewed in the direction indicated by the arrows showing the interconnect substrate on which semiconductor chips 190 and 200 are mounted. FIG. 18 is a cross-sectional view along the line XVIII—XVIII shown in FIG. 16 viewed in the same direction showing the interconnect substrate on which the semiconductor chips 190 and 200 are mounted.

An interconnect substrate 160 includes first and second regions 170 and 180 and an interconnect pattern 162. The interconnect substrate 160 has a mounting region 181 for an electronic chip (first semiconductor chip 190). The mounting region 181 is formed in the second region 180. The first and second regions 170 and 180 are formed on one surface of the interconnect substrate 160. The first region 170 is formed adjacent to the second region 180. As the material for the interconnect substrate 160, the content described in the first embodiment can be applied.

There are no specific limitations t o the planar configuration of the interconnect substrate 160. The interconnect substrate 160 is rectangular in many cases as in an example shown in FIG. 16. A pair of parallel sides of the interconnect substrate 160 among the four sides of the rectangle is formed by the continuous end portions of the first and second regions 170 and 180. One of the other pair of parallel sides is formed by the end portion of the first region 170, and the other is formed by the end portion of the second region 180.

The interconnect pattern 162 is formed on the interconnect substrate 160. The interconnect pattern 162 is formed on one surface of the interconnect substrate 160. The interconnect pattern 162 may be formed of a conductive material such as copper. The interconnect pattern 162 may adhered to the interconnect substrate 1600 through an adhesive (not shown), thereby forming a three-layer substrate. The interconnect pattern 162 may be formed on the interconnect substrate 160 without using an adhesive, thereby forming a two-layer substrate.

The interconnect pattern 162 includes a plurality of first land sections 173, a plurality of second land sections 184, and a plurality of connection sections 165.

The first land sections 173 are formed in the first region 170 of the interconnect substrate 160. The first land sections 173 may be formed in the center portion (area excluding the end portions) of the first region 170.

A plurality of through-holes 176 are formed in the first region 170 of the interconnect substrate 160, as shown in FIG. 17. The first land sections 173 are formed on each through-hole 176. Each through-hole 176 is filled with a conductive material 177 for achieving electrical connection with external terminals 172. Both surfaces of the interconnect substrate 160 may be electrical connected by plating the through-holes 176 with the conductive material 177 such as copper, thereby forming through-holes.

The second land sections 184 are formed in the end portions of the second region 180 of the interconnect substrate 160. In the example shown in FIG. 16, the second land sections 184 are formed in a pair of parallel end portions of the second region 180 which forms a pair of parallel sides of the interconnect substrate 160 continuously with a pair of parallel end portions of the first region 170.

The second land sections 184 are used for electrical connection with the electronic chip (semiconductor chip 190). In the case where the semiconductor chip 190 is bonded face down, the second land sections 184 are located inside the mounting region 181. In the case where the semiconductor chip 190 is bonded face up, the second land sections 184 may be located outside the mounting region 181.

Note that plated leads 188 may remain from the second land sections 184 toward the edges. The plated leads 188 are used to electrically connect the areas of the interconnect pattern 162 which are not already electrically connected, in order to simultaneously electroplate the interconnect pattern 162 formed on a substrate greater than the interconnect substrate 160. When the interconnect substrate 160 is obtained by punching the substrate out into individual pieces after electroplating, part of the plated leads 188 remains on the interconnect substrate 160. The interconnect pattern 162 may be provided with electroless plating without forming the plated leads 188.

The connection sections 165 of the interconnect pattern 162 are used to electrically connect at least one (only one in many cases) of the first land sections 173 to at least one (only one in many cases) of the second land sections 184.

In the example shown in FIG. 16, the connection sections 165 are formed outside the first land sections 173 in the first region 170. Specifically, the first land sections 173 are formed in the center portion (area excluding the end portions) of the first region 170, and the connection sections 165 are formed outside the center portion (but inside the end portions). For example, the connection sections 165 run between a pair of parallel end portions of the first region 170 continuous with a pair of parallel end portions of the second region 180 and the region (center portion) in which the first land sections 173 are formed.

The connection sections 165 are formed closer to the center than the second land sections 184 in the second region 180. Specifically, the second land sections 184 are formed closer to the center than the pair of parallel end portions of the second region 180 continuous with the pair of parallel end portions of the first region 170.

According to this configuration, since the connection sections 165 run closer to the center than the second land sections 184, the connection sections 165 can be formed without increasing the area of the interconnect substrate 160. In particular, in the case where the first land sections 173 are formed in the center portion of the first region 170, the connection sections 165 can be allowed to run through the shortest route. Specifically, the connection sections 165 is not lengthened uselessly in the direction which intersects the direction in which the first and second regions 170 and 180 are aligned. As a result, an increase in the interconnect length can be prevented.

Figure 19:
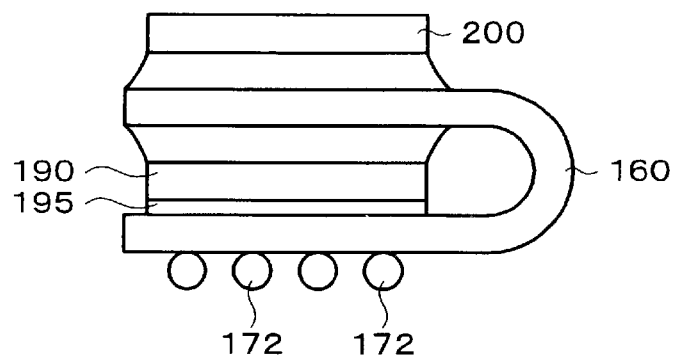
FIG. 19 is a view showing the semiconductor device according to the third embodiment to which the present invention is applied.

It is preferable that the connection sections 165 be covered with insulation films 164 such as resists. For example, the insulation films 164 are formed on the connection sections 165 across the first and second regions 170 and 180. In particular, in the case where the interconnect substrate 160 is bent as shown in FIG. 19, it is preferable that the connection sections 165 be covered with the insulation films 164 at least in the bent section. The insulation films 164 may be formed using a solder resist material or the like. The region greater than the region shown in FIG. 19 excluding the second land sections 184 and the first land sections 173 may be covered with the insulation films 164. This prevents occurrence of short circuits between the connection sections 165 or between the interconnect patterns due to adhesion of conductive foreign matter, for example.

One or more holes (slits 182, for example) may be formed in the second region 180 of the interconnect substrate 160. The holes in the second region 180 are formed through the interconnect substrate 160. The second land sections 184 are located on one of the openings. These holes may be formed at every position corresponding to a second land section 184. In this case, these holes may be filled with conductive materials. Through-holes may be formed by forming a conductive material on the inner surface of the holes. The second land sections 184 can be electrically conducted to the surface of the interconnect substrate 160 opposite to the surface on which the interconnect pattern 162 is formed by forming these holes.

The holes formed in the interconnect substrate 160 may be the slits 182. Long, narrow slits 182 are formed. The second land sections 184 are formed on the slits 182 by forming part of the interconnect pattern 162 across the slits 182 in the direction of the width. Two or more second land sections 184 may be formed on one slit 182. For example, the slits 182 may be formed under the second land sections 184 arranged in a pair of parallel end portions of the second region 180, thereby exposing a group of the second land sections 184 in each end portion. According to this configuration, the second land sections 184 can be exposed to both surfaces of the interconnect substrate 160 by merely forming the slits 182. Note that the embodiments of the holes (slits 182) formed in the interconnect substrate 160 of the present embodiment may be applied to the above-described embodiments.

The semiconductor device includes the interconnect substrate 160 and the semiconductor chip 190 (first semiconductor chip) mounted in the mounting region 181. The semiconductor chip 190 is mounted in the mounting region 181 of the interconnect substrate 160. The semiconductor chip 190 is mounted on the surface on which the interconnect pattern 162 of the interconnect substrate 160 is formed.

The semiconductor chip 190 may be bonded face down to the interconnect substrate 160. The semiconductor chip 190 may be adhered to the interconnect substrate 160 using an adhesive 193 or the like. A plurality of electrodes 192 of the semiconductor chip 190 is electrically connected to the second land sections 184. The electrodes 192 may be electrically connected to the second land sections 184 using a conductive members or using a method of diffusing the materials using supersonic waves, heat, or the like can be applied. As the conductive members, solder, anisotropic conductive film, anisotropic conductive adhesive, conductive paste, conductive adhesive, and the like can be used. The anisotropic conductive film may be formed by dispersing conductive particles in the adhesive 193. Brazing such as soldering can be given as examples of a method of electrical connection using the conductive members.

The semiconductor device further includes a semiconductor chip 200 (second semiconductor chip). The second semiconductor chip 200 is mounted on the interconnect substrate 160 on the surface opposite to the first semiconductor chip 190. The second semiconductor chip 200 is superposedly mounted on the first semiconductor chip 190 on a plane. The second semiconductor chip 200 may be electrically connected to the second land sections 184 through the holes (slits 182, for example), as shown in FIG. 18. The second semiconductor chip 200 is electrically connected to the second land sections 184 on the surface facing the slits 182. In this case, electrodes common to the first semiconductor chip 190 and the second semiconductor chip 200 can be connected from the external terminals 172 using interconnects with the same length. Therefore, the electrical characteristics of the interconnects from both semiconductor chips to the external terminals can be made equal.

The second semiconductor chip 200 may be bonded face down to the interconnect substrate 160, as shown in FIG. 18. The second semiconductor chip 200 may be adhered to the interconnect substrate 160 using an adhesive 203 or the like. A plurality of electrodes 202 of the second semiconductor chip 200 are electrically connected to the second land sections 184. For example, bumps 204 may be formed on the electrodes 202 of the second semiconductor chip 200 and electrically connected to the second land sections 184 inside the slits 182. The bumps 204 may be formed by piling up a plurality of balls of melted bonding wire using a stud bump method. The description for the first semiconductor chip 190 can be applied to the electrical connection between the bumps 204 and the second land sections 184.

The semiconductor chips 190 and 200 may be die-attached face up to the interconnect substrate 160 and mounted by wire bonding. Face up bonding and face down bonding may be used in combination for mounting the semiconductor chips 190 and 200.

The semiconductor chips 190 and 20 (first and second semiconductor chips) may have a mirror-symmetrical circuit structure with respect to the boundary of the interconnect substrate 160. According to this configuration, the same devices can be electrically connected to the same second land section 184 through the shortest route. In the case where the semiconductor chips 190 and 200 are used as memories, for example, information can be read out from or written into memory cells of each memory at the same address through the same second land section 184.

In the present embodiment, a plurality of (two, for example) semiconductor chips 190 and 200 may be separately controlled using the same external terminal arrangement by separating the semiconductor chips 190 and 200 merely by connection of a chip-select terminal.

The semiconductor device is formed of a plurality of layered semiconductor chips 190 and 200 by bending the interconnect substrate 160, as shown in FIG. 19. For example, the surface of the semiconductor chip 190 opposite to the surface adhered to the second region 180 is adhered to the first region 170 using an adhesive 195 or the like.

In the example shown in FIG. 19, a plurality of the first land sections 173 (external terminals 172) are disposed inside the mounting region 181 by bending the interconnect substrate 160. Specifically, the first and second regions 170 and 180 are superposed by bending the interconnect substrate 160 so that a plurality of the first land sections 173 formed in the center portion of the first region 170 is disposed, inside the mounting region 181. According to this configuration, since the first land sections 173 are disposed inside the mounting region,181, a semiconductor device having approximately the same size as the semiconductor chips 190 a nd 200 can be provided.

According to the present embodiment, the connection sections 165 which connect the first and the second land sections 173 and 184 run closer to the center than the second land sections 184 in the second region 180, thereby preventing the area of the interconnect substrate 160 from increasing outside the second land sections 184. Specifically, the connection sections 165 can be formed by effectively using space. As a result, an increase in the interconnect length can be prevented.

The method of manufacturing a semiconductor device according to the present embodiment includes a step of mounting the semiconductor chip 190 (first semiconductor chip) in the mounting region 181 of the interconnect substrate 160. The method further includes a step of mounting the semiconductor chip 200 (second semiconductor chip) on the interconnect substrate 160 on the surface opposite to the semiconductor chip 190. The semiconductor chip 200 may be electrically connected to the second land sections 184 of the interconnect pattern 162 through the holes (slits 182, for example) formed in the interconnect substrate 160. The semiconductor chips 190 and 200 may be layered by bending the interconnect substrate 100. In this case, a plurality of the first land sections 173 are disposed inside the mounting region 181. According to this configuration, a semiconductor device having approximately the same size as the semiconductor chips 190 and 200 can be manufactured.

The description for the first and second embodiments can be applied to the present embodiment as far as possible.

Figure 20:
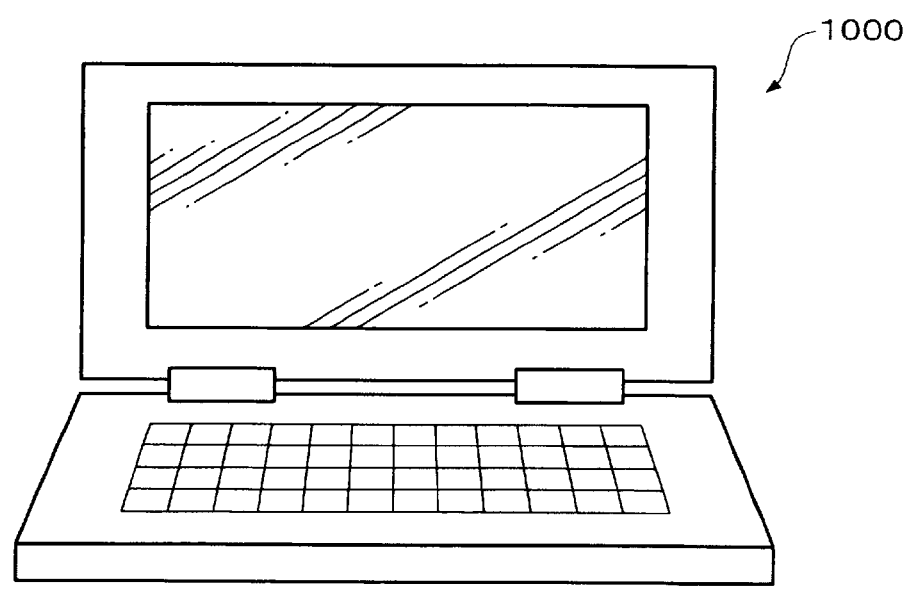
FIG. 20 is a view showing an electronic instrument including a semiconductor device manufactured by applying a method according to the present invention.
Figure 21:
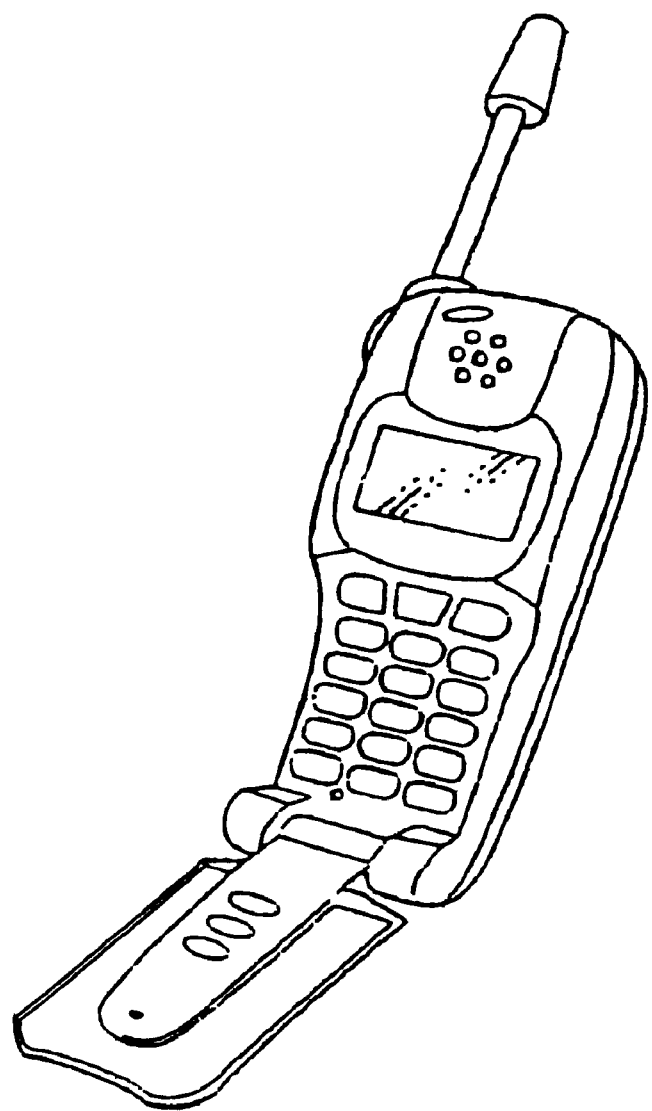
FIG. 21 is a view showing an electronic instrument including a semiconductor device manufactured by applying a method according to the present invention.

FIG. 20 shows a notebook-type personal computer 1000 as an example of an electronic instrument including a semiconductor device to which the present invention is applied. FIG. 21 shows a portable telephone 1100.

Among the constituents of the present invention, a "semiconductor chip" may be replaced by an "electronic chip". Electronic parts may be manufactured by mounting the electronic chip (may be either active device or passive device) on a substrate in the same manner as in the case of the semiconductor chip. As examples of electronic parts manufactured by using such an electronic chip, optical devices, resistors, capacitors, coils, oscillators, filters, thermosensors, thermistors, varistors, variable resistors, fuses, and the like can be given.

What is claimed is:

1. An interconnect substrate comprising:
an upper substrate including a mounting region for a first electronic chip and an upper interconnect pattern; and
a lower substrate including a first region to which the upper substrate is adhered, a second region including a mounting region for a second electronic chip, and a lower interconnect pattern, wherein the lower interconnect pattern comprises a plurality of first lower land sections which are formed in the center portion of the first region and are electrically connected to the upper interconnect pattern, a plurality of second lower land sections which are formed in the second region and electrically connected to the second electronic chip, and a plurality of lower connection sections which run outside the center portion in the first region and connect the first lower land sections to the second lower land sections, wherein the lower connection sections run closer to the center than the second lower land sections in the second region.

2. The interconnect substrate as defined in claim 1,
wherein the upper interconnect pattern comprises a plurality of first upper land sections which are formed in the center portion of the upper substrate and are electrically connected to the first lower land sections, a plurality of second upper land sections which are electrically connected to the first electronic chip, and a plurality of upper connection sections which connect the first upper land sections to the second upper land sections.

3. The interconnect substrate as defined in claim 2,
wherein the lower substrate is rectangular,
wherein the first region and the second region are disposed side by side,
wherein one end portion of a pair of parallel end portions of the first region and one end portion of a pair of parallel end portions of the second region are disposed along one side of a pair of parallel sides of the lower substrate, and
wherein the other end portion of a pair of parallel end portions of the first region and the other end portion of a pair of parallel end portions of the second region are disposed along the other side of a pair of parallel sides of the lower substrate.

4. The interconnect substrate as defined in claim 3,
wherein the second lower land sections are formed in a pair of parallel end portions of the second region, and
wherein the second upper land sections are formed in a pair of parallel end portions of the upper substrate above a pair of parallel end portions of the first region of the lower substrate.

5. The interconnect substrate as defined in claim 4,
wherein the second upper land sections and the second lower land sections are formed in the same arrangement pattern, and one of the second upper land sections and one of the second lower land sections formed at the same position in each arrangement pattern are electrically connected to the same first upper land section and the same first lower land section.

6. The interconnect substrate as defined in claim 4,
wherein dummy patterns electrically insulated from the upper interconnect pattern and the lower interconnect pattern are formed in a pair of parallel end portions of the first region of the lower substrate to the same thickness as the lower interconnect pattern.

7. The interconnect substrate as defined in claim 1,
wherein an insulation film is formed on the lower connection sections at least in the area across the first and second regions.

8. The interconnect substrate as defined in claim 1,
wherein the upper interconnect pattern is formed on one surface of the upper substrate, wherein the lower interconnect pattern is formed on one surface of the lower substrate, and wherein the surface of the upper substrate opposite to the surface on which the upper interconnect pattern is formed is adhered to the surface of the lower substrate on which the lower interconnect pattern is formed.

9. The interconnect substrate as defined in claim 8, wherein a plurality of through-holes are formed in the upper substrate, and the first upper land sections and the first lower land sections are electrically connected via the through-holes.

10. The interconnect substrate as defined in claim 9, wherein the first upper land sections are formed over the through-holes, wherein the through-holes are located over the first lower land sections, and wherein a conductive material in contact with the first upper land sections and the first lower land sections is provided in the through-holes.

11. The interconnect substrate as defined in claim 1, wherein a plurality of through-holes for forming a plurality of external terminals which are electrically connected to the first lower land sections and project from a surface of the lower substrate opposite to a surface on which the lower interconnect pattern is formed, are formed in the lower substrate.

12. The interconnect substrate as defined in claim 1, wherein at least one hole for electrically connecting the second lower land sections to a surface of the lower substrate opposite to a surface on which the lower interconnect pattern is formed, are formed in the second region of the lower substrate.

13. A semiconductor device comprising:

the interconnect substrate as defined in claim 12;

a first semiconductor chip mounted in the mounting region of the upper substrate; and a second semiconductor chip mounted in the mounting region of the lower substrate.

14. The semiconductor device as defined in claim 13, further comprising:

a third semiconductor chip electrically connected to the second lower land sections through the holes, and is mounted on a surface of the lower substrate opposite to a surface on which the second semiconductor chip is mounted.

15. The semiconductor device as defined in claim 14, wherein the second and third semiconductor chips have a mirror-symmetrical circuit structure with respect to a boundary of the lower substrate.

16. The semiconductor device as defined in claim 13, wherein the first and second semiconductor chips are layered by bending the lower substrate.

17. A circuit board comprising the semiconductor device as defined in claim 13 mounted thereon.

18. An electronic instrument comprising the semiconductor device as defined in claim 13.

19. The semiconductor device as defined in claim 13, wherein the second semiconductor chip is wider than a region in which the plurality of lower connection sections are formed.

20. The interconnect substrate as defined in claim 12, wherein the hole is a slit, wherein part of the lower interconnect pattern is formed across the slit, and wherein the second lower land sections are formed over the slit.

21. An interconnect substrate on which electronic chips are respectively mounted in a plurality of adjacent mounting regions, the interconnect substrate comprising:

a plurality of first land sections for external connection which are formed in one of the mounting regions located at an end portion;

a plurality of second land sections which are formed in each of the mounting regions and are electrically connected to each of the electronic chips; and a plurality of connection sections which electrically connect the second land sections respectively formed in the adjacent mounting regions, wherein the connection sections are formed outside the second land sections in an area between the one of the mounting regions in which the first land sections are formed and another of the mounting regions adjacent to the one of the mounting regions, and wherein the connection sections are formed inside the second land sections in an area between the mounting regions at an uneven-numbered position from the first land sections and the mountings region at an even-numbered position from the first land sections.

22. The interconnect substrate as defined in claim 21, wherein the second land sections are formed outside the first land sections.

23. The interconnect substrate as defined in claim 22, wherein the mounting regions are aligned in one direction, and wherein the second land sections are aligned in the direction in which the mounting regions are aligned.

24. The interconnect substrate as defined in claim 23, wherein the second land sections are formed in each of the mounting regions in the same alignment pattern, and wherein a pair of second land sections formed at a line-symmetrical position with respect to a boundary between the mounting regions are electrically connected in the adjacent mounting regions.

25. The interconnect substrate as defined in claim 21 wherein an insulation film is fonrned on the connection sections at least in an area across the adjacent mounting regions.

26. A semiconductor device comprising:

the interconnect substrate as defined in claim 21; and semiconductor chips respectively mounted in the mounting regions.

27. The semiconductor device as defined in claim 26, wherein the semiconductor chips respectively mounted in the mounting regions are layered by bending the interconnect substrate.

28. An interconnect substrate comprising a first region, a second region which is formed adjacent to the first region and includes a mounting region for an electronic chip, and an interconnect pattern, wherein the interconnect pattern comprises a plurality of first land sections formed in the first region, a plurality of second land sections which are formed in the second region and are electrically connected to the electronic chip, and a plurality of connection sections which run closer to a center than the second land sections in the second region and electrically connect the first land sections to the second land sections.

29. The interconnect substrate as defined in claim 28,
wherein the interconnect substrate is rectangular, and pairs of parallel end sections of the first and second regions are connected to form a pair of parallel sides of the rectangle.

30. The interconnect substrate as defined in claim 28,
wherein the second land sections are formed in a pair of parallel end portions of the second region continuous with the first region.

31. The interconnect substrate as defined in claim 28,
wherein a plurality of through-holes for forming external terminals, which are electrically connected to the first land sections and are projected from a surface opposite to a surface on which the interconnect pattern is formed, are formed in the first region.

32. The interconnect substrate as defined in claim 28,
wherein an insulation film is formed on the connection sections at least in the area across the first and second regions.

33. The interconnect substrate as defined in claim 28,
wherein at least one hole for electrically connecting the second land sections to a surface opposite to a surface on which the interconnect pattern is formed, are formed in the second region.

34. The interconnect substrate as defined in claim 33,
wherein the hole is a slit,
wherein part of the interconnect pattern is formed across the slit, and
wherein the second land sections are formed over the slit.

35. A semiconductor device comprising:
the interconnect substrate as defined in claim 33; and
a first semiconductor chip mounted in the mounting region.

36. The semiconductor device as defined in claim 35, further comprising:
a second semiconductor chip electrically connected to the second land sections through the holes, and is mounted on a surface of the lower substrate opposite to a surface on which the first semiconductor chip is mounted.

37. The semiconductor device as defined in claim 36,
wherein the first and second semiconductor chips have a mirror-symmetrical circuit structure with respect to a boundary of the interconnect substrate.

38. The semiconductor device as defined in claim 35,
wherein the first land sections are disposed inside the mounting region by bending the interconnect substrate.

* * * * *